(12) United States Patent
Ross et al.

(10) Patent No.: US 10,398,061 B1
(45) Date of Patent: Aug. 27, 2019

(54) PORTABLE DATA CENTER FOR DATA TRANSFER

(71) Applicant: Amazon Technologies, Inc., Seattle, WA (US)

(72) Inventors: Peter George Ross, Olympia, WA (US); Frank Charles Paterra, Kirkland, WA (US); Darin Lee Frink, Lake Tapps, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/197,636

(22) Filed: Jun. 29, 2016

(51) Int. Cl.
| | |
|---|---|
| G06F 1/16 | (2006.01) |
| H05K 7/14 | (2006.01) |
| H05K 7/18 | (2006.01) |
| H05K 7/20 | (2006.01) |
| G06F 1/20 | (2006.01) |

(52) U.S. Cl.
CPC ......... *H05K 7/20745* (2013.01); *G06F 1/206* (2013.01); *H05K 7/2079* (2013.01); *H05K 7/20145* (2013.01)

(58) Field of Classification Search
CPC .............. H05K 7/2079; H05K 7/1497; H05K 7/20736; H05K 7/20745; H05K 7/20781; H05K 7/20836; G06F 1/16; G06F 1/20
See application file for complete search history.

(56) References Cited

U.S. PATENT DOCUMENTS

| | | | | |
|---|---|---|---|---|
| 4,861,060 A * | 8/1989 | Schult | ................ | B62D 53/0885 |
| | | | | 254/93 HP |
| 7,854,652 B2 * | 12/2010 | Yates | ........................ | E04H 5/02 |
| | | | | 361/690 |
| 8,322,679 B2 * | 12/2012 | Chen | ..................... | H05K 7/1497 |
| | | | | 248/562 |
| 8,833,094 B2 * | 9/2014 | Hellriegel | ............... | G06F 1/183 |
| | | | | 361/679.47 |
| 8,967,392 B1 * | 3/2015 | Czamara | ................ | F16M 11/00 |
| | | | | 211/26 |
| 9,043,035 B2 | 5/2015 | Chainer et al. | | |

(Continued)

OTHER PUBLICATIONS

U.S. Appl. No. 15/360,948, filed Nov. 23, 2016, Dougal Stuart Ballantyne, et al.

(Continued)

*Primary Examiner* — Courtney L Smith
(74) *Attorney, Agent, or Firm* — Robert C. Kowert; Meyertons, Hood, Kivlin, Kowert & Goetzel, P.C.

(57) ABSTRACT

A portable data center includes a cooling system comprising a cooling circuit, one or more air plenums, and one or more air moving devices. The cooling circuit circulates a heat transfer fluid through a portion of the cooling circuit that passes through the one or more air plenums. The heat transfer fluid that passes through the one or more air plenums cools air flowing through the one or more air plenums via the one or more air moving devices. The cooling circuit also circulates the heat transfer through a separate portion of the portable data center where heat is rejected from the heat transfer fluid into the separate portion of the portable data center. In some embodiments, the air plenums and at least a portion of the cooling circuit are mounted in a sub-floor space between a platform within the portable data center and an outer structure of the portable data center.

20 Claims, 18 Drawing Sheets

(56) References Cited

U.S. PATENT DOCUMENTS

| | | | |
|---|---|---|---|
| 9,101,080 B2 * | 8/2015 | Czamara | H05K 7/1497 |
| 9,526,193 B2 * | 12/2016 | Demange | H05K 7/2079 |
| 9,843,470 B1 * | 12/2017 | Gartrell | H04L 29/08 |
| 2004/0100770 A1 * | 5/2004 | Chu | H05K 7/20754 361/698 |
| 2008/0060790 A1 | 3/2008 | Yates et al. | |
| 2008/0123288 A1 | 5/2008 | Hillis | |
| 2009/0262501 A1 | 10/2009 | Claassen et al. | |
| 2010/0126696 A1 | 5/2010 | Novotny et al. | |
| 2010/0139887 A1 | 6/2010 | Slessman | |
| 2010/0304657 A1 * | 12/2010 | Gallmann | G06F 1/20 454/184 |
| 2011/0014862 A1 * | 1/2011 | Honold | G06F 1/20 454/184 |
| 2011/0094714 A1 * | 4/2011 | Day | H05K 7/20745 165/121 |
| 2011/0146964 A1 * | 6/2011 | Kang | G06F 1/20 165/200 |
| 2011/0175498 A1 * | 7/2011 | Bash | F24F 11/0001 312/107 |
| 2011/0223849 A1 * | 9/2011 | Ishimine | F24F 3/044 454/184 |
| 2012/0087087 A1 | 4/2012 | Nicolai et al. | |
| 2012/0140415 A1 | 6/2012 | Driggers | |
| 2012/0173894 A1 * | 7/2012 | Driggers | H05K 7/2079 713/300 |
| 2012/0246661 A1 | 9/2012 | Nishimura | |
| 2012/0300391 A1 | 11/2012 | Keisling et al. | |
| 2013/0023594 A1 | 1/2013 | Van Hardeveld et al. | |
| 2013/0074697 A1 | 3/2013 | Verschoor et al. | |
| 2013/0083476 A1 * | 4/2013 | Clidaras | G06F 1/20 361/679.41 |
| 2013/0128455 A1 | 5/2013 | Koblenz et al. | |
| 2014/0126149 A1 | 5/2014 | Campbell et al. | |
| 2014/0297855 A1 | 10/2014 | Moore et al. | |
| 2015/0136939 A1 | 5/2015 | Haselden | |
| 2015/0373881 A1 | 12/2015 | Ross | |
| 2015/0382512 A1 | 12/2015 | Rogers | |
| 2016/0007506 A1 | 1/2016 | Karasawa et al. | |
| 2016/0021792 A1 | 1/2016 | Minegishi et al. | |
| 2016/0037688 A1 | 2/2016 | Rodriguez | |
| 2016/0057893 A1 | 2/2016 | Tabe et al. | |
| 2016/0081229 A1 | 3/2016 | Eichelberg et al. | |
| 2016/0081230 A1 | 3/2016 | Noteboom et al. | |
| 2016/0120067 A1 | 4/2016 | McDonnell et al. | |
| 2016/0128238 A1 * | 5/2016 | Shedd | F25B 23/006 361/679.47 |
| 2016/0135329 A1 | 5/2016 | Lewis, II | |
| 2016/0157386 A1 | 6/2016 | Goulden et al. | |
| 2016/0192542 A1 | 6/2016 | LeFebvre et al. | |

OTHER PUBLICATIONS

U.S. Appl. No. 15/197,630, filed Jun. 29, 2016, Darin Lee Frink et al.

U.S. Appl. No. 15/197,633, filed Jun. 29, 2016, Peter George Ross et al.

"Dell Launches Enterprise Class Fully Mobile Data Center Solution to Power Mobile Government and Military Operations", Dell, Jul. 17, 2012, pp. 1-2.

R.L. Nisonger, et al., "Measurement of Ride Vibrations on Semi-trailers Incorporating Different Suspensions", Technical Memorandum. University of Michigan, Highway Safety Research Institute, 1979, pp. 1-30.

"Ruggedized Data Centers", Retrieved from URL: http://www.astmodular.com/rugged_it/index on May 23, 2016, pp. 1-2.

IBM, "IBM Portable Modular Data Center Overview for Critical Facilities Round Table", Apr. 15, 2011, pp. 1-32.

Emilio Sapina, "Vibration Isolation in Data Centers", Secure Technical Rooms, Jan. 2014, pp. 1-28.

\* cited by examiner

PORTABLE DATA CENTER FOR DATA TRANSFER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Some organizations may conduct computer operations using multiple large scale computing facilities or may utilize a service of an organization that operates one or more large scale computing facilities. Often, such large scale computing facilities are located remote from one another and/or remote from an organization that utilizes services provided by one of the large scale computing facilities. In such circumstances, data may be exchanged over a long-distance network connection, such as the Internet. When transferring large quantities or volumes of data over a long distance network connection, such as the Internet, transmission of the data can be costly and time consuming.

Figure 1:
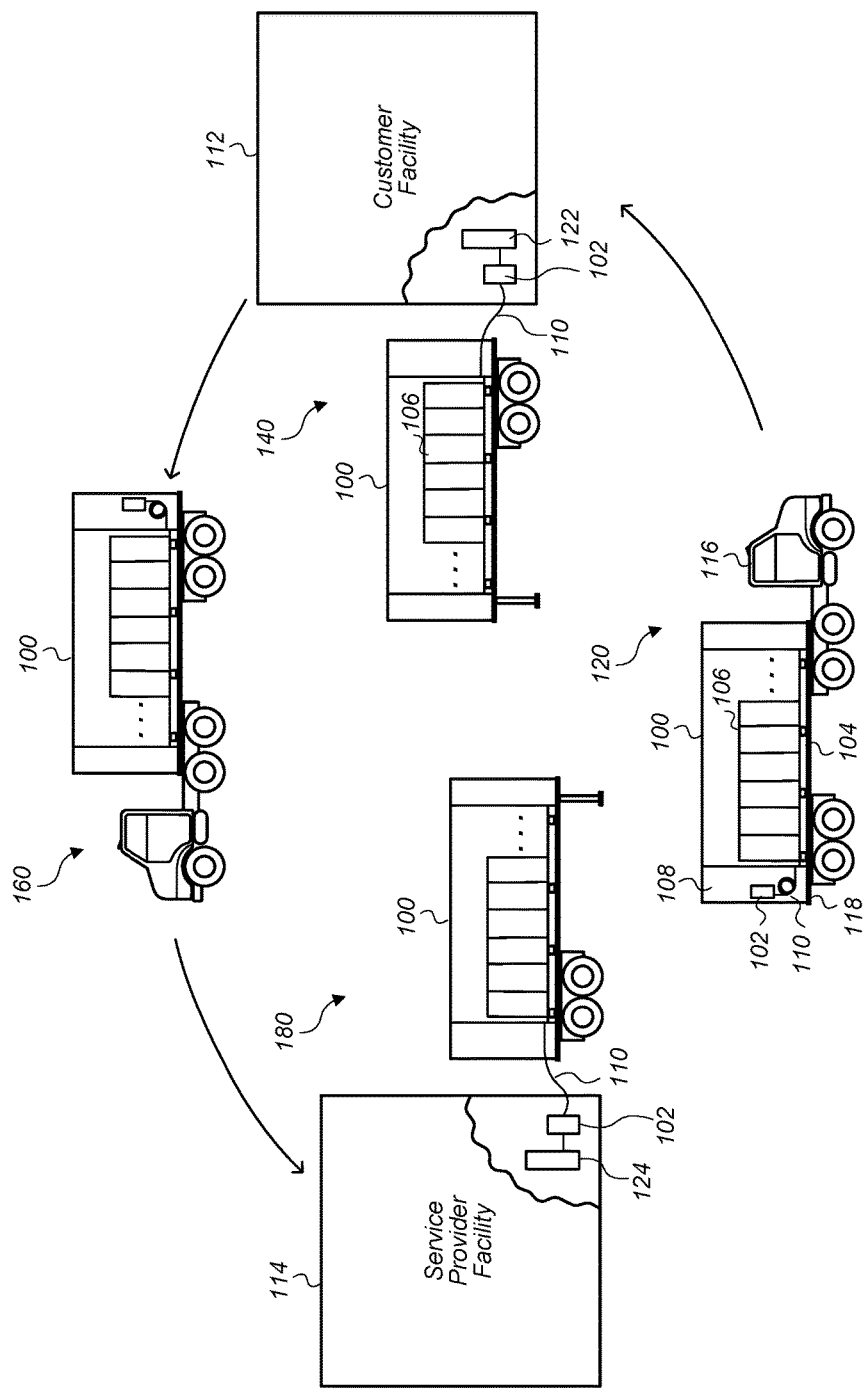
FIG. 1 illustrates a portable data center with computing devices installed in the portable data center being transported between a service provider facility and a customer facility, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for transferring data using a portable data center configured to be transported with installed computing devices are disclosed. According to some embodiments, a system includes a portable data with racks installed in the portable data center. Computing devices are installed in the racks and the portable data center is configured to be transported from a first location to a second location with the computing devices installed in the racks of the portable data center. For example, computing devices may be installed in a portable data center before the portable data center is transported from a service provider facility to a customer facility of a customer of the service provider. The portable data center also includes a networking device coupled with the computing devices of the portable data center via a tether cable. The networking device coupled via the tether cable is configured to be stowed in a storage compartment of the portable data center while the portable data center is being transported, is configured to deploy into a facility at the second location, for example a customer facility, and is configured to provide a connection from the deployed networking device deployed in the second location to the computing devices of the portable data center via the tether cable. The networking device is further configured to provide an interface between the computing devices of the portable data center and a computing device of the facility at the second location For example, a portable data center may include a networking switch or router and a length of cable configured to be stored in a storage compartment of the portable data center while the portable data center is being transported. Upon arriving at a customer facility, the networking switch or router and the length of cable that tethers the network switch or router to computing devices of the portable data center may be removed from the storage compartment of the portable data center and may be deployed into the customer facility. The deployed networking switch or router may couple with a computing device of the customer facility and establish a connection between the computing device of the customer facility and a computing device of the portable data center. The deployed networking switch or router may also provide an interface for communications between the computing device of the customer facility and the computing device of the portable data center. In some embodiments, the interface provided by the deployed networking device may encrypt data being transferred from the customer facility to the portable data center.

According to some embodiments, a method includes establishing a connection between a computing device of a portable data center and a computing device of a customer facility via an interface of a piece of networking equipment of the portable data center deployed into the customer facility; storing data from the computing device of the customer facility on the computing device of the portable data center; and transporting the portable data center storing the data from the customer facility to another location.

According to some embodiments, a method includes receiving a portable data center at a service provider facility, wherein the portable data center comprises a computing device storing customer data of a customer of the service provider; and transferring the customer data stored in the computing device of the portable data center to a computing device of a service provider network of the service provider.

According to some embodiments, a portable data center includes an outer structure, an internal platform mounted within the outer structure, a vibration reduction device mounted between the outer structure of the portable data center and the internal platform mounted within the portable data center, and a rack of computing devices mounted on the internal platform. The portable data center is configured to be transported from a first location to a second location with the rack of computing devices mounted on the internal platform and the vibration reduction device is configured to reduce transmission of vibrations experienced by the outer structure of the portable data center to the internal platform of the portable data center and the computing devices mounted in the rack mounted on the internal platform while the portable data center is being transported from the first location to the second location. For example, a portable data center may include vibration reduction devices, such as air springs, between an outer structure of the portable data center and an internal platform of the portable data center. The air springs may reduce vibrations experienced by computing devices mounted in a rack coupled to the internal platform while the portable data center is being transported. In some embodiments, other types of vibration reduction devices may be used.

According to some embodiments, a system includes an outer structure, a platform mounted in the outer structure, wherein the platform is configured to accept mounting of a rack of computing devices on the platform, and a vibration reduction device mounted between the outer structure and the platform. The vibration reduction device is configured to reduce transmission of vibrations experienced by the outer structure to the platform such that vibrations experienced by computing devices mounted in a rack coupled to the platform do not exceed a threshold level of vibrations.

According to some embodiments, a method includes transporting a portable data center from a first location to a second location, wherein said transporting comprises storing data on computing devices mounted in the portable data center while the portable data center is transported from the first location to the second location; and dissipating, by a vibration reduction device, vibrations experienced by an outer structure of the portable data center such that a level of vibrations experienced by the computing devices do not exceed a threshold level of vibration.

According to some embodiments, a portable data center includes racks of computing devices arranged in a row in a compute space of the portable data center. The portable data center includes a cold aisle on a first side of the row of racks in the compute space and a hot aisle on a second side of the row of racks in the compute space. The portable data center also includes a sub-floor cooling system mounted in a space in the portable data center between an outer structure of the portable data center and a platform of the portable data center, wherein the racks of computing devices are mounted on the platform of the portable data center. The sub-floor cooling system includes an air plenum between the hot aisle and the cold aisle in the space between the outer structure of the portable data center and the platform of the portable data center, a cooling circuit, and an air moving device configured to draw heated air from the hot aisle into the air plenum and direct cooled air into the cold aisle from the air plenum. The cooling circuit includes a fluid moving device configured to circulate a heat transfer fluid between a portion of the cooling circuit mounted in the air plenum and a portion of the cooling circuit mounted in a portion of the portable data center that is separate from the compute space. The cooling circuit is configured to remove heat from air passing through the air plenum and reject heat into the separate portion of the portable data center that is separate from the compute space. In some embodiments, the separate portion of the portable data center includes one or more other heat producing pieces of equipment, such as a transformer. In some embodiments, the separate portion of the portable data center also includes one or more air moving devices and one or more vents configured to circulate air through the separate portion of the portable data center and to reject heat from the separate portion of the portable data center into an ambient environment external to the portable data center.

According to some embodiments, a portable data center cooling system includes an air plenum between a hot aisle and a cold aisle of a compute space; a cooling circuit, wherein a portion of the cooling circuit is mounted in the air plenum; and an air moving device configured to draw air into the air plenum from the hot aisle and direct the air across the portion of the cooling circuit mounted in the air plenum and into the cold aisle via the air plenum. The cooling circuit is configured to circulate a heat transfer fluid between the portion of the cooling circuit mounted in the air plenum and a portion of the cooling circuit mounted in a portion of the portable data center separate from the compute space of the portable data center and reject heat from the cooling circuit into the separate portion of the portable data center.

According to some embodiments, a method of cooling a portable data center includes circulating air through an air plenum and circulating a heat transfer fluid through a cooling circuit. Circulating the air through the air plenum includes drawing the air from a compute space of the portable data center into the air plenum, passing the air across a heat exchanger of the cooling circuit mounted in the air plenum, and returning the air to the compute space of the portable data center. Circulating the heat transfer fluid through the cooling circuit includes circulating the heat transfer fluid through the heat exchanger mounted in the air plenum to remove heat from air passing through the air plenum and circulating the heat transfer fluid through another heat exchanger in a portion of the portable data center separate from the compute space to reject heat from the heat transfer fluid into the separate portion of the portable data center.

As used herein, a "compute space" means a room of a portable data center in which computing devices, such as rack-mounted servers, can be operated.

As used herein, an "aisle" means a space next to one or more racks.

As used herein, "air moving device" includes any device, element, system, or combination thereof that can move air. Examples of air moving devices include fans, blowers, and compressed air systems.

As used herein, "ambient" refers to a condition of outside air at the location of a system or portable data center. An ambient temperature may be taken, for example, at or near an intake hood of an air handling system.

As used herein, a "cable" includes any cable, conduit, or line that carries one or more conductors and that is flexible over at least a portion of its length. A cable may include a connector portion, such as a plug, at one or more of its ends. In some embodiments, a cable may be a copper cable, a fiber optic cable, or other suitable type of cable.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "heat exchanger" means a device configured to transfer thermal energy between a first fluid and a second fluid. In some embodiments, a heat exchanger may include coils, fins, tubes, etc. In some embodiments, a heat exchanger may exchange heat between a liquid fluid and air.

As used herein, a "hot aisle" means an aisle into which heated air can be discharged for use in removing heat from a system, such as a rack computing system.

As used herein, a "portable data center" includes any transportable facility or portion of a facility in which computing operations are carried out. A portable data center may include servers dedicated to specific functions or serving multiple functions. Examples of computer operations include information processing, communications, testing, simulations, and information storage.

As used herein, "power panel" means any panel, device, module, component, or combination thereof, that can be used to transfer or distribute electrical power from one or more input conductors to one or more output conductors. A power panel may be housed in an enclosure, such as a cabinet.

As used herein, a "fluid moving device" means a device configured to perform work on a fluid to increase a pressure of the fluid or to cause the fluid to flow. A fluid moving device may be a centrifugal pump, a reciprocating pump, or other devices configured to perform work on a fluid or cause a fluid to flow.

As used herein, "rack computing systems" means a computing system that includes one or more computing devices mounted in a rack.

As used herein, a "space" means a space, area or volume.

Some service providers may provide data storage and/or computing services amongst various other types of services to customers of the service provider. Such service providers may operate one or more data centers comprising computing equipment and networking equipment configured to provide data storage, transmission, and/or computation services to customers. For example, a customer of a service provider may store data, in some cases several terabytes or petabytes of data, using storage devices of a network maintained by the service provider. Some customers may also desire to perform computing operations using large quantities of data stored by a service provider. In some situations a customer may desire to transfer a large quantity of data to or from a service provider in connection with use of a service offered by the service provider, such as a data storage service. Transferring large quantities of data over long-distance network connections, such as the Internet, may be costly and time consuming for the customer.

In some embodiments, in order to transfer large quantities of data between remote locations such as a data center of a service provider and a customer facility, a portable data center configured to be transported with installed computing devices may be employed to transfer the data more quickly and at lower cost than transferring the data over a long-distance network connection, such as the Internet. Transferring large quantities of data using a portable data center configured to be transported with installed computing devices may include transferring data stored at a first location onto computing devices of the portable data center and physically transporting the portable data center including the computing devices storing large quantities of data to another location. For example large quantities of data may be transferred between a customer computing facility and a service provider facility, such as a data center, using a portable data center configured to be physically transported between the two locations while storing large quantities of data in computing devices installed in the portable data center while the portable data center is being transported.

FIG. 1 illustrates a portable data center with computing devices installed in the portable data center being transported between a service provider facility and a customer facility, according to some embodiments.

At position 120 portable data center 100 is being transported with rack computing devices 106 installed in portable data center 100. In some embodiments, in order to prevent damage to computing devices installed in a portable data center while the portable data center is being transported, the portable data center may include a vibration isolation platform to prevent road induced vibrations or impacts experienced during transport from being transmitted to computing devices installed in the portable data center. For example, portable data center 100 includes vibration isolation platform 104. In addition, in some embodiments, a portable data center may include a tethered piece of networking equipment configured to be stowed in the portable data center when the portable data center is being transported and configured to be deployed into a computing facility when the portable data center reaches a computing facility. For example, portable data center 100 includes piece of networking equipment 102 stowed in compartment 108 of portable data center 100 and tethered to computing devices 106 via tether cable 110. In some embodiments, computing devices 106 may include one or more additional pieces of networking equipment, such as switches, routers, etc.

In some embodiments, a portable data center configured to be transported with installed computing devices, such as portable data center 100, may be dispatched to a customer facility, such as customer facility 112, from a service provider facility, such as service provider facility 114. In some embodiments, a portable data center configured to be transported with installed computing devices, such as portable data center 100, may be transported from another location other than a service provider facility or a customer facility. In some embodiments, a third-party service may provide use of a portable data center configured to be transported with installed computing devices to customers of the third-party service.

In some embodiments, a portable data center, such as portable data center 100, may be mounted on a trailer, such as a trailer of an 18-wheel truck. In some embodiments, a portable data center may be mounted on a rail car or may be transported via airplane. In some embodiments, a portable data center configured to be transported with installed computing devices may be transported via other modes of transportation.

At position 140, portable data center 100 is located at customer facility 112. At position 140 portable data center 100 is shown mounted on a trailer and disconnected from a truck that pulls the trailer. In some embodiments, a portable data center configured to be transported with installed computing devices may be removed from a trailer when operating at a customer facility, such as customer facility 112, or may remain on a trailer while being operated at a customer facility, such as customer facility 112. In some embodiments, a truck, such as truck 116, may remain coupled with a trailer, such as trailer 118, on which a portable data center, such as portable data center 100, is loaded while the portable data center is being operated at a customer facility.

At a customer facility, a piece of networking equipment stowed in a portable data center and coupled to computing devices of the portable data center via a tether cable may be deployed into the customer facility to establish a connection between computing devices of the customer facility and computing devices of the portable data center configured to be transported with installed computing devices. For example, at position 140 networking device 102 is deployed into customer facility 112 and is connected to computing devices 106 of portable data center 100 via extended tether cable 110. A customer facility may include a single computing device or may include multiple computing devices, or may even include a customer data center comprising several computing devices and pieces of networking equipment. At position 140, deployed networking device 102 of portable data center 100 is coupled with computing device 122 of customer facility 112. Deployed networking device 102 and tether cable 110 establish a physical connection between computing devices 106 of portable data center 100 and computing device 122 of customer facility 112.

Various customers of a service provider may operate different types of computing devices and networking equipment. Also, computing devices and networking equipment of the various customers of a service provider may utilize different operating systems and/or may have different software configurations. A tethered piece of networking equipment that is stowed in a portable data center and deployed into a customer facility may provide a consistent interface for computing devices of a portable data center when interacting with computing devices of a customer at a customer facility. For example, some customers may utilize computing devices with fiber optic interfaces, whereas other customers may operate equipment with non-fiber optic interfaces. By deploying a piece of networking equipment of a portable data center into a customer facility, a connection between computing devices of a portable data center and computing equipment of a customer facility having various physical connector types and/or operating environments may be established without having to provide various different types of cabling and assorted adaptors in the portable data center to accommodate the various interfaces and/or configurations that may be encountered at a customer facility. Also, computing devices of a portable data center, such as computing devices 106, may receive data in a consistent format based on software operating on the deployed piece of networking equipment as opposed to various data formats that may be encountered if receiving data directly from computing devices at a customer facility. Furthermore, in some embodiments, data transferred from a customer facility, such as customer facility 112, may be encrypted before leaving the customer facility. In such embodiments, a deployed piece of networking equipment, such as networking device 102, may be deployed into a customer facility and may encrypt customer data to be transferred to a portable data center, such as portable data center 100, before the data leaves the customer facility. In some embodiments, data may be encrypted at a deployed piece of networking equipment deployed in a customer facility, such as networking device 102 deployed in customer facility 112, and may be further encrypted by additional pieces of networking equipment of a portable data center, such as one of computing devices 106, before being stored in computing devices of a portable data center, such as computing devices 106.

In some embodiments, a tether cable that tethers a piece of networking equipment to a computing device of a portable data center may be a fiber-optic cable, copper cable, or other suitable type of cable. In some embodiments, a wireless connection may couple a piece of network equipment of a portable data center deployed in a customer facility to a computing device of the portable data center. For example, in some embodiments a piece of network equipment of a portable data center that is configured to deploy into a customer facility may communicate with computing devices of the portable data center via open-field optics, microwave communications, or other methods of wireless communication.

After data has been transferred to and stored on computing devices of a portable data center configured to be transported with installed computing devices, the portable data center may be transported to a second location with the transferred data stored in computing devices of the portable data center. For example, at position 160 portable data center 100 is being transported to service provider facility 114 with data transferred from computing device 122 of customer facility 112 stored in computing devices 106 of portable data center 100. In a similar manner as described above in regard to transporting the portable data center with installed computing devices, a vibration isolation platform of a portable data center may reduce transmission of vibrations experienced by an outer structure of the portable data center during transport such that vibrations experienced by computing devices of the portable data center storing transferred data, such as computing devices 106, do not exceed a threshold level of vibrations.

In some embodiments, a portable data center configured to be transported with installed computing devices, such as portable data center 100, may include a tracking system configured to communicate a current location of the portable data center to a remote system that tracks the portable data center during transport of the portable data center. In some embodiments, a portable data center configured to be transported with installed computing devices, may include a security system configured to monitor attempts to access computing devices, such as computing devices 106 of portable data center 100, and configured to issue an alert in response to detecting any attempts to access computing devices of the portable data center or other threats to the security of the portable data center while being transported.

In some embodiments, data stored in computing devices of a portable data center, such as computing devices 106 of portable data center 100, may be encrypted and an encryption key for decrypting the encrypted data may be sent to a destination location for the portable data center separate from the portable data center.

At position 180, portable data center 100 is located at service provider facility 114. Service provider facility 114 may be a data center of a service provider that provides storage services to a customer that operates customer facility 112. In some embodiments, a service provider may operate multiple facilities and may operate a service provider network such that data transferred to a particular service provider facility, such as service provider facility 114, may be stored at any of the facilities, such as other data centers, operated by the service provider and/or connected to the service provider network. At position 180, networking device 102 of portable data center 100 is deployed into service provider facility 114 and is connected to computing devices 106 of portable data center 100 via extended tether cable 110. Extended tether cable 110 connects networking device 102 and computing devices 106. Networking device 102 is also coupled with computing device 124 of service provider facility 114. A physical connection is provided between computing devices 106 of portable data center 100 and computing device 124 of service provider facility 114 via networking device 102 deployed in service provider facility 114 and tether cable 110. In some embodiments, a portable data center, such as portable data center 100, may include an additional data port, and the additional data port may be configured to accept a networking cable of a service provider facility. In such embodiments, computing devices of a portable data center may be physically connected to computing devices of a service provider network, such as computing device 124 of service provider facility 114, without using a piece of networking equipment stowed in the portable data center and connected to computing devices of the portable data center via a tether cable, such as without using networking device 102 and tether cable 110. In some embodiments, data may be transferred between computing devices of a service provider facility and computing devices of a portable data center or between computing devices of a customer facility and computing devices of the portable data center via a wireless connection.

Figure 2:
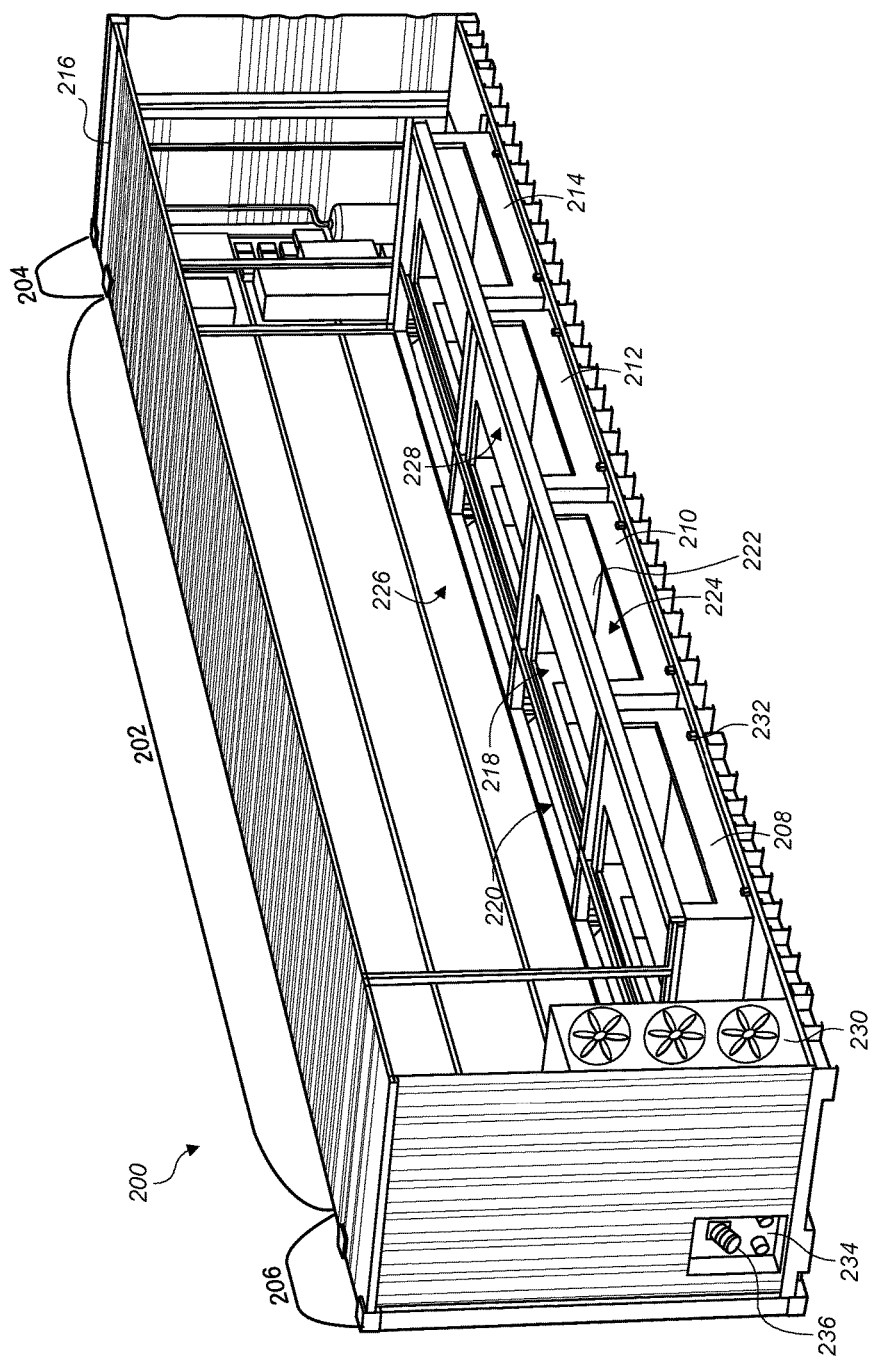
FIG. 2 illustrates an interior view of a portable data center configured to be transported with installed computing devices, according to some embodiments.

FIG. 2 illustrates an interior view of a portable data center configured to be transported with installed computing devices, according to some embodiments. Portable data center 200 includes a compute space 202, an equipment and control portion 204, and a heat rejection portion 206. In some embodiments, a compute space of a portable data center includes internal platforms, such as platforms 208, 210, 212, and 214 mounted within an outer structure of the portable data center, such as outer structure 216 of portable data center 200. A sub-floor cooling system may be mounted in a space below an internal platform of a portable data center and a platform of a portable data center. The sub-floor cooling system may include one or more air moving devices configured to draw heated air in a hot aisle of a compute space into an air plenum below a platform that functions as a floor for the compute space. The one or more air moving devices may further cause the air to pass through a heat exchanger of a cooling circuit that is mounted in the air plenum and cause cooled air that has passed across the heat exchanger of the cooling circuit to be directed into a cold aisle of the compute space. For example, the structure of platforms 208, 210, 212, and 214 include a location for mounting racks of computing devices, an air inlet 224 into an air plenum 222 passing below the respective platforms, and a floor vent 220 allowing air to pass through the respective platforms into a cold aisle 226. In some embodiments, air inlet 224 draws air into air plenum 222 from hot aisle 228. In some embodiments, air inlet 224 may be a floor vent in a platform similar to floor vent 220. In some embodiments, an air plenum, such as air plenum 222 may include an air filter, and a structure of a platform, such as one of platforms 208, 210, 212, or 214, may include an access opening, such as access opening 218, for accessing air filters or other equipment located in an air plenum.

A cooling circuit of a portable data center may circulate a heat transfer fluid through a portion of the cooling circuit passing through respective air plenums below respective ones of platforms 208, 210, 212, and 214. The cooling circuit may also circulate the heat transfer fluid through a heat exchanger in a heat rejection portion of a portable data center, such as heat rejection portion 206. A heat rejection portion of a portable data center may include other pieces of heat producing equipment in addition to a heat exchanger of a cooling circuit, such as one or more transformers. In addition, a heat rejection portion of a portable data center may include one or more air moving devices, such as fans 230. Air moving devices of a heat rejection portion of a portable data center may cause air to be expelled from the heat rejection portion of the portable data center into an external environment. The expelled air may be hot air that carries away waste heat with the air as the air is expelled from the heat rejection portion of the portable data center. Also, a heat rejection portion of a portable data center may include one or more vents to allow ambient air to flow into the heat rejection portion of the portable data center. Thus, as hot air is expelled from a heat rejection portion of a portable data center, cooler ambient air may be drawn into the heat rejection portion of the portable data center. The cooler ambient air may absorb waste heat from equipment located in the heat rejection portion of the portable data center and may be expelled from the heat rejection portion of the portable data center along with absorbed waste heat.

In some embodiments, a portable data center may include connectors, such as cam lock connectors, configured to couple a cooling circuit of the portable data center with an external auxiliary cooling system. For example, in some climates or under some workloads, air moving devices of a heat rejection portion of a portable data center along with a heat exchanger of a cooling circuit in a heat rejection portion of a portable data center may not be able to remove sufficient waste heat from the cooling circuit to adequately cool computing devices mounted in a portable data center. In such circumstances, an auxiliary cooling system such as a mechanical chiller, may be coupled to a cooling circuit of a portable data center to provide additional cooling capacity. For example, a mechanical chiller, such as a chiller that chills water, may be coupled to a cooling circuit of a portable data center, via connectors such as quick connect connections 234. In some embodiments, a portable data center may include a power connection configured to couple with a power cable that provides power to an auxiliary cooler, such as power connector 236.

A portable data center, such as portable data center 200, may also include vibration reduction devices, such as vibration reduction devices 232, mounted between an outer structure of the portable data center and internal platforms of the portable data center. For example, vibration reduction devices 232 are mounted between a floor of outer structure 216 and internal platforms 208, 210, 212, and 214. In some embodiments, vibration reduction devices may be air springs, an air cushion, a mechanical spring and dashpot, a hydraulic damper, a polymer damper, or other suitable devices configured to dissipate vibrations.

In some embodiments, an equipment and control portion of a portable data center, such as equipment and control portion 204 of portable data center 200, may include a piece of networking equipment coupled to computing devices of a portable data center via a tether cable, such as networking device 102 and tether cable 110 discussed in regard to FIG. 1. In addition, an equipment and control portion of a portable data center may include other equipment such as a fluid moving device of a cooling circuit, electrical panels, power distribution devices, a fire suppression system, a tracking system, a security system, and other support equipment that supports operation of computing devices of a portable data center.

FIG. 3A-D illustrate respective views of a portable data center configured to be transported with installed computing devices including an end view, a front view, and side views of either side of the portable data center, according to some embodiments. Portable data center 300 illustrated in FIGS. 3A-D may be the same portable data center 200 as illustrated in FIG. 2 or the same portable data center 100 as illustrated in FIG. 1.

Figure 3A:
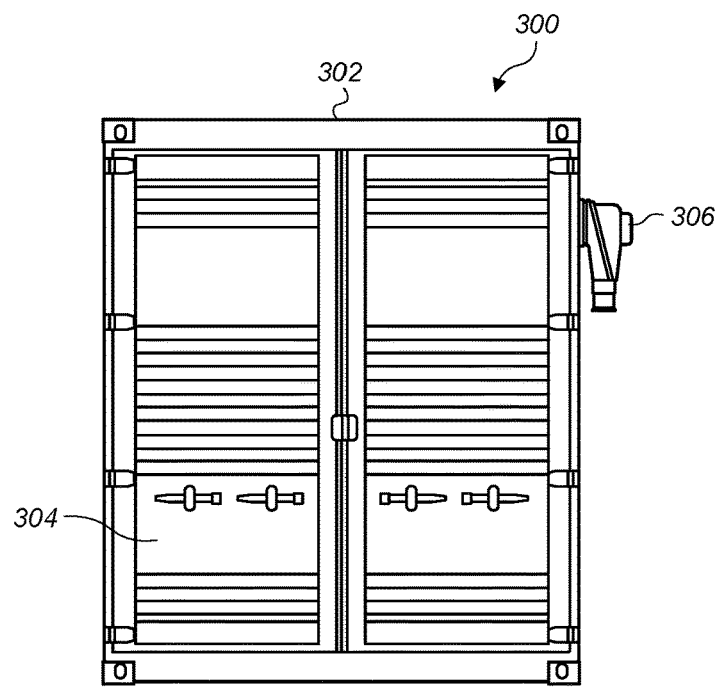
FIG. 3A illustrates an end view of a portable data center configured to be transported with installed computing devices, according to some embodiments.

FIG. 3A illustrates end 302 of portable data center 300 that includes doors 304, which provide access to equipment in an equipment and control portion (such as equipment and control portion 204) of portable data center 300. For example, a piece of networking equipment tethered to computing devices of portable data center 300 may be stowed in the equipment and control portion of data center 300 and may be accessed for deployment into a customer facility via doors 304 of portable data center 300.

In some embodiments, a portable data center may receive electrical power from an external power source such as a utility power source or a generator. A portable data center, such as portable data center 300, may include an incoming power connector, such as incoming power connector 306, configured to couple with an external power source. In some embodiments, a portable data center, such as portable data center 300, may include one or more electrical panels in an equipment and control portion (such as equipment and control portion 204) for managing distribution of incoming power. In addition, in some embodiments, a portable data center may be configured to receive high voltage power from an external power source and may include a transformer in a heat rejection portion of the portable data center (such as heat rejection portion 206). The transformer may be configured to step down high voltage power to medium or low voltage power that is then distributed to computing devices mounted in racks in the portable data center.

Figure 3B:
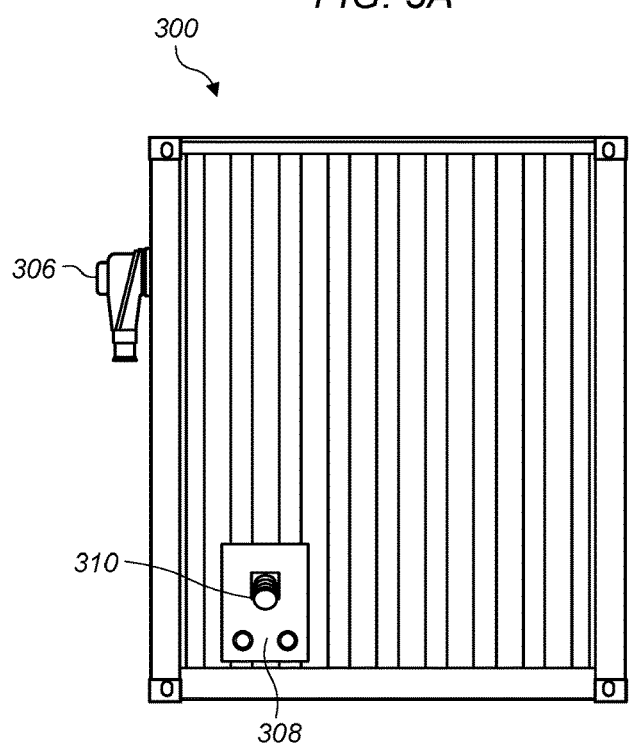
FIG. 3B illustrates a front view of a portable data center configured to be transported with installed computing devices, according to some embodiments.

FIG. 3B illustrates a front view of portable data center 300, according to some embodiments. Portable data center 300 may include connectors configured to couple an auxiliary cooling system with a cooling circuit of portable data center 300, such as connectors 308. In addition, a portable data center, such as portable data center 300, may include a power connector configured to provide electrical power to an auxiliary cooling system, such as power connector 310. In some embodiments connectors 308 may be quick connect connectors such as quick connect connections 234 described in regard to FIG. 2. Also, power connector 310 may be the same as power connector 236 described in regard to FIG. 2.

Figure 3C:
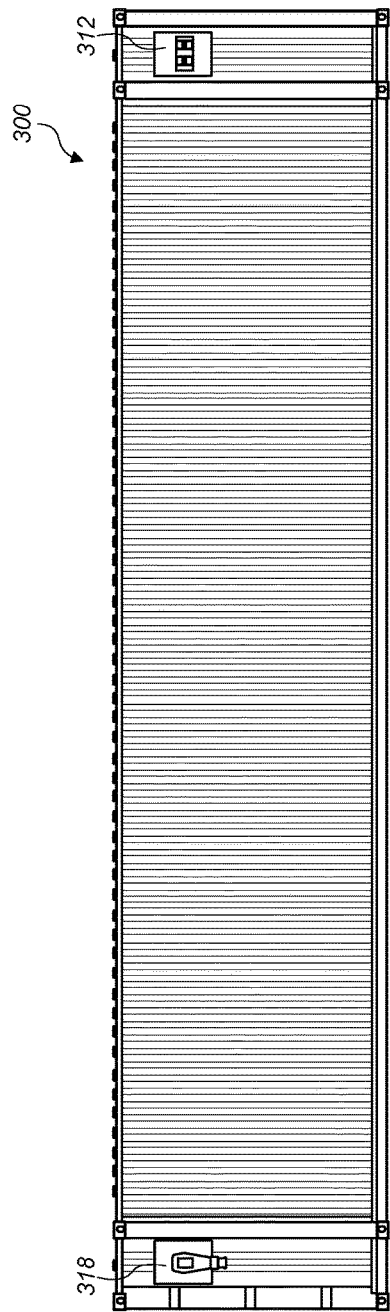
FIG. 3C illustrates a side view of a portable data center configured to be transported with installed computing devices, according to some embodiments.
Figure 3D:
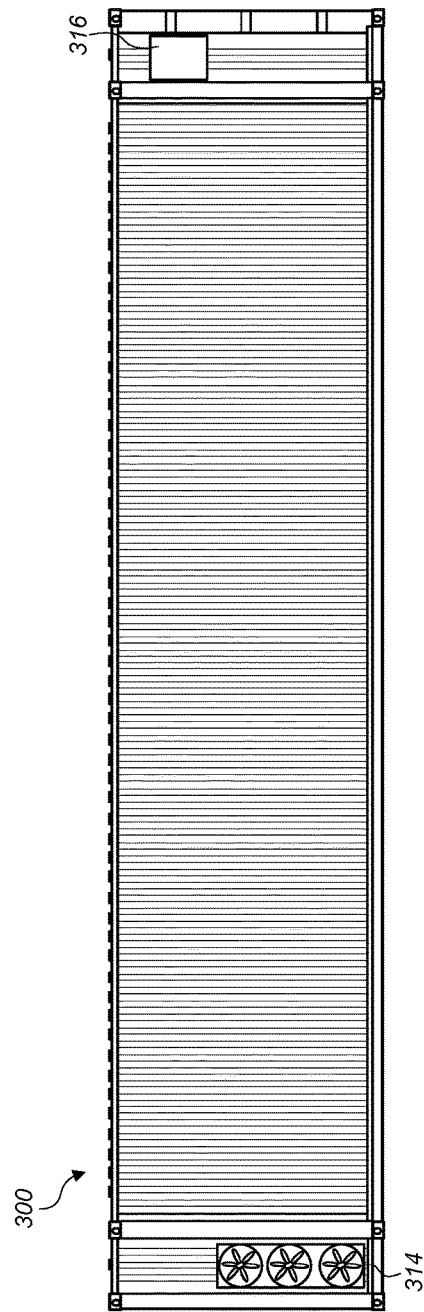
FIG. 3D illustrates a side view of a portable data center configured to be transported with installed computing devices, according to some embodiments.

FIG. 3C illustrates a side view of portable data center 300, according to some embodiments. Portable data center 300 includes incoming power connector 318 and transformer shut-off switch 312. In some embodiments a portable data center, such as portable data center 300 may include an external power switch such as transformer shut-off switch 312 that allows power to the portable data center to be shut off from the exterior of the portable data center. FIG. 3D illustrates a side view of another side of portable data center 300, according to some embodiments. Portable data center 300 includes heat rejection portion air moving devices 314 and antennae 316. Heat rejection air moving devices 314 may be similar to fans 230 described in regard to FIG. 2.

In some embodiments, a portable data center, such as portable data center 300, may include a GPS antennae, a network antennae, or other means of communicating with and receiving communications from remote locations. For example, portable data center 300 includes antennae 316.

Deployable Networking Equipment and Tether Cable

Figure 4A:
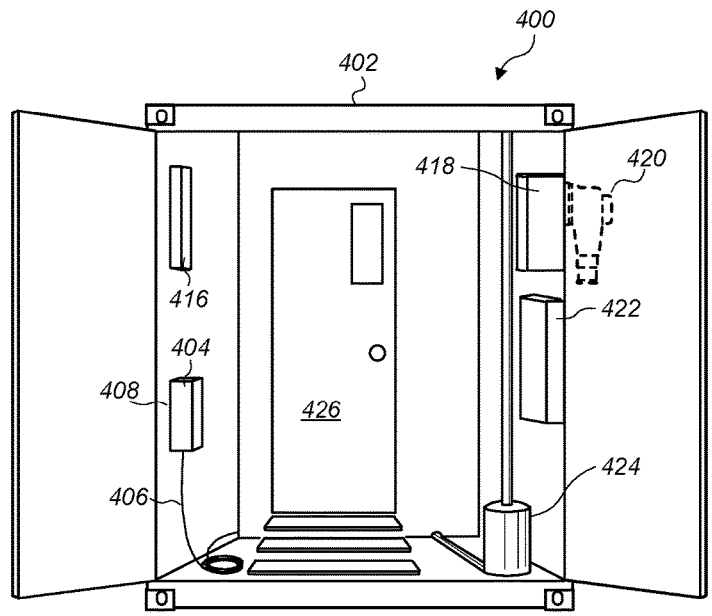
FIG. 4A illustrates a portion of a portable data center configured to be transported with installed computing devices, according to some embodiments.
Figure 4B:
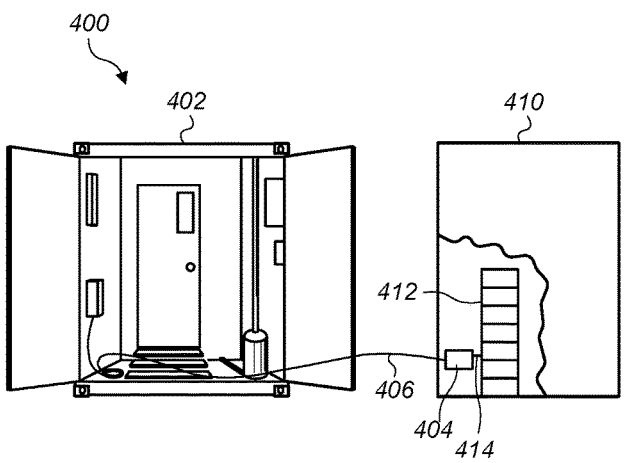
FIG. 4B illustrates a piece of networking equipment coupled with a portable data center via a tether cable deployed in a customer computing facility, according to some embodiments.

FIG. 4A illustrates a portion of a portable data center configured to be transported with installed computing devices, according to some embodiments. Portable data center 400 includes equipment and control portion 402. Equipment and control portion 402 includes a storage 408 for a piece of networking equipment 404 and tether cable 406. Networking equipment 404 and tether cable 406 may be removed from being stowed in storage 408 of equipment and control portion 402 of data center 400 and deployed into a customer facility. For example, in FIG. 4B a piece of networking equipment coupled with a portable data center via a tether cable is deployed in a customer computing facility, according to some embodiments. In FIG. 4B, networking equipment 404 is deployed in customer facility 410 and is connected to computing devices of data center 400 via extended tether cable 406. Networking equipment 404 is coupled to computing devices 412 of customer facility 410 via one or more adapters 414. In some embodiments, an adapter 414 may be a cable with a connector end configured to connect into a computing device of a customer facility. In some embodiments, a storage of a portable data center, such as storage 408, may include various adapters configured to connect with different connector types that may be encountered at customer facilities. In some embodiments, a piece of networking equipment to be deployed into a customer facility, such as networking equipment 404, may include multiple ports configured to accommodate different connector types that may be encountered in a customer facility.

In some embodiments, an equipment and control portion of a portable data center also includes a portion of an antennae, such as a network or GPS antennae, for example antennae 416. In some embodiments, an equipment and control portion of a portable data center also includes electrical power panels, such as power panels 418 coupled with incoming power connector 420. An equipment and control portion may also include a fire suppression system, building management system, and security system. For example, equipment and control portion 402 includes support system panel 422 that includes a fire suppression system, a building management system, and a security system for portable data center 400. An equipment and control portion of a portable data center may also include a mobile power storage device, such as a battery, that provides electrical power to a building management system, fire suppression system, or security system while a portable data center is in transit and not connected to a power source. In some embodiments, a building management system, security system or fire suppression system may communicate information being monitored about the portable data center to a remote location while the portable data center is being transported. In some embodiments, such systems may be configured to issue an alarm to a remote location if one or more conditions are met or one or more thresholds are exceeded. In some embodiments, a fire suppression system, security system, and/or building management system may be combined into a common portable data center management system.

In some embodiments, a fluid moving device of a circulation circuit may be located in an equipment and control portion of a portable data center. For example, pump 424 of a cooling circuit of portable data center 400 is located in equipment and control portion 402. An equipment and control portion of a portable data center may be separated from a compute space of a portable data center and a door may be included between the equipment and control portion of the portable data center and the compute space of the portable data center to allow personnel to access the compute space of the portable data center. For example, equipment and control portion 402 includes door 426 that provides access to a compute space of portable data center 400.

Figure 5:
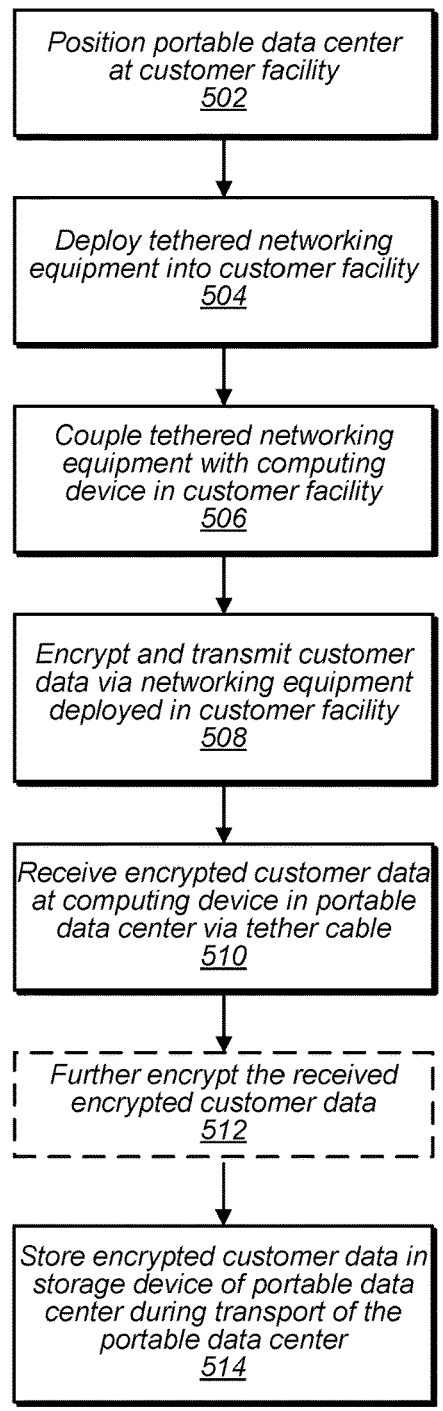
FIG. 5 illustrates a method of transferring data using a portable data center configured to be transported with installed computing devices, according to some embodiments.

FIG. 5 illustrates a method of transferring data using a portable data center configured to be transported with installed computing devices, according to some embodiments.

At 502 a portable data center is positioned at a customer facility. The portable data center may arrive at the customer facility with computing devices pre-installed in racks of the portable data center. In some embodiments, a portable data center may include a sub-floor cooling system and cooling circuit that cool the computing devices without auxiliary equipment. In some embodiments, a portable data center may operate in high temperature climates or under high-load levels that require supplemental cooling that supplements a cooling circuit of the portable data center. In such embodiments, an auxiliary cooling system may be coupled with the portable data center when the portable data center is positioned at a customer facility. The auxiliary cooling may be provided by a portable chiller or may be supplied by a cooling water system of the customer facility. Positioning a portable data center at a customer facility may include connecting a power supply, such as a power cable to an incoming power connector of the portable data center. In some embodiments, a portable data center may receive utility power from a utility power source at the customer facility or may receive electrical power from a generator.

At 504 a piece of networking equipment stowed in the portable data center while the portable data center is being transported to the customer facility is deployed into the customer facility. The piece of networking equipment may include a switch, router, or other piece of networking equipment. The piece of networking equipment may be connected to computing devices installed in racks of the portable data center via a tether cable from the piece of networking equipment back to the portable data center and via one or more pieces of networking equipment mounted in the portable data center. For example, one or more of the computing devices in the racks of the portable data center may be a piece of networking equipment.

At 506, the deployed piece of networking equipment tethered to the portable data center is connected with a computing device of the customer facility. In some embodiments, a piece of networking equipment that deploys into a customer facility may include various connector types to accommodate various types of connectors that may be encountered in a customer facility. For example, a piece of networking equipment may include interfaces for accepting various types of fiber-optic connections and various types of non-fiber optic connections. In some embodiments, a piece of networking equipment that deploys into a customer facility may also be configured to operate with various software packages and operating systems that may be encountered in a customer facility.

At 508 customer data stored in computing devices of the customer facility is encrypted and transmitted to computing devices of the portable data center via the deployed piece of networking equipment and the tether cable connecting the deployed piece of networking equipment with the portable data center. The customer data may be encrypted via the deployed piece of networking equipment deployed into the customer facility such that the customer data is encrypted prior to leaving the customer facility. In some embodiments, a line encryption may be used where the customer data is encrypted between the deployed piece of networking equipment and a piece of networking equipment installed in the portable data center.

At 510 encrypted customer data is received at one or more computing devices of the portable data center via the tether cable and the deployed piece of networking equipment. In some embodiments, the encrypted customer data may be stored as is, may be further encrypted, or a line encryption may be decrypted and the customer data may be subsequently encrypted with a higher level encryption.

At 512, the received encrypted data is further encrypted by one or more computing devices in the portable data center. Block 512 is illustrated with a dotted line to signify that in some embodiments 512 may be omitted. For example, in some embodiments encrypted customer data may be stored as received at the portable data center and with the encryption as performed by the deployed piece of networking equipment without further encryption. In some embodiments, the encrypted customer data may have been encrypted with a line level encryption and may be further encrypted with a more robust encryption by one or more computing devices of the portable data center before being stored on the computing devices of the portable data center. In some embodiments, a line level encryption may be removed, e.g. decrypted at one or more computing devices of the portable data center and a more robust encryption may be applied to the customer data before being stored on computing devices of the portable data center.

At 514, encrypted customer data is stored in a storage device, such as a rack mounted computing device, of the portable data center. The portable data center may be transported to another location, such as a service provider facility, with the encrypted customer data stored on computing devices of the portable data center. A decryption key for the encrypted customer data may be sent to a destination location, such as a service provider facility, via another means other than the portable data center. Thus, in the event that the portable data center is stolen or otherwise comprised in transit between locations, the data stored in the portable data center will be encrypted and the portable data center will not include an encryption key for decrypting the encrypted customer data.

Figure 6:
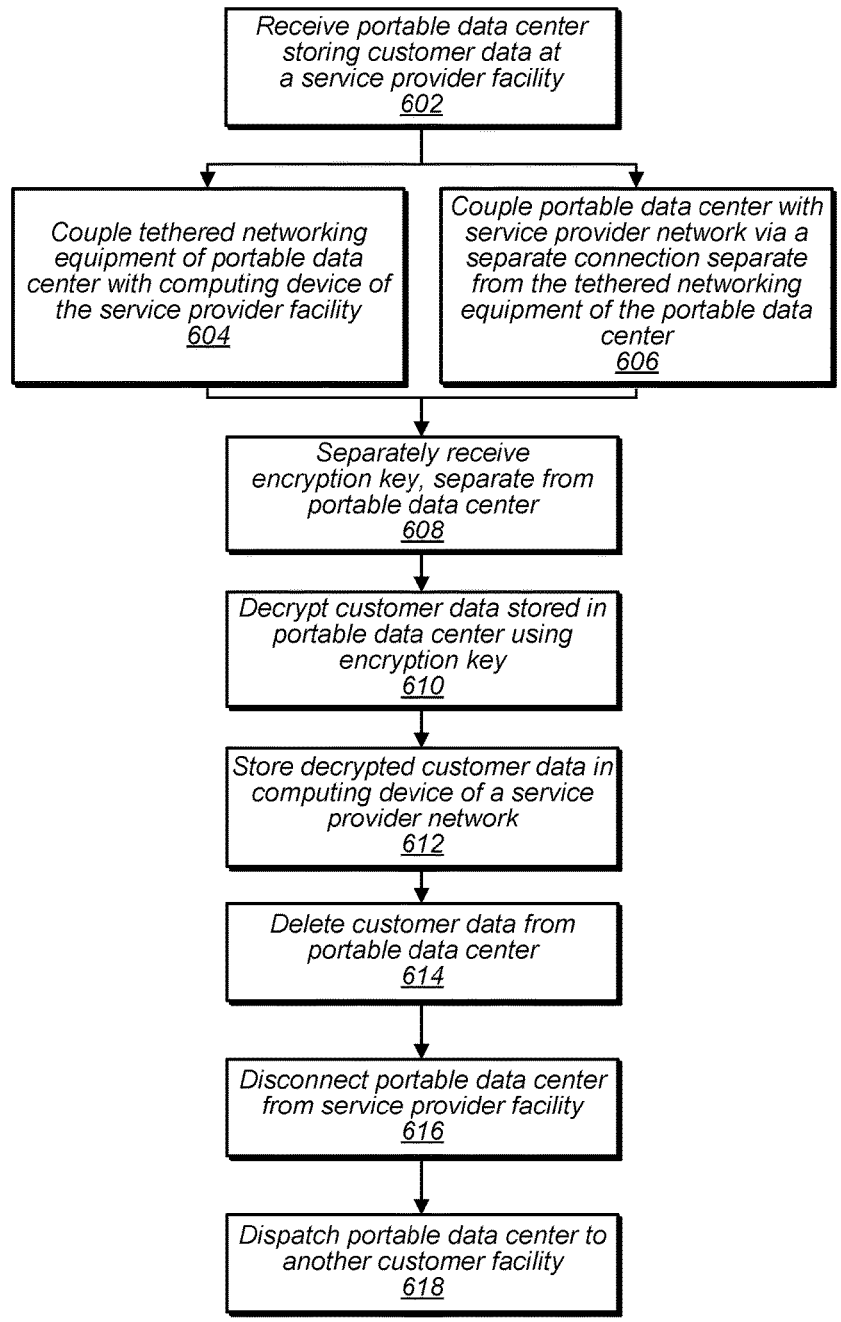
FIG. 6 illustrates a method of transferring data using a portable data center configured to be transported with installed computing devices, according to some embodiments.

FIG. 6 illustrates a method of transferring data using a portable data center configured to be transported with installed computing devices, according to some embodiments.

At 602, a portable data center storing customer data is received at a service provider facility. In some embodiments, a service provider facility may be a data center operated by the service provider that provides services to customers such as storage services, compute services, or data transmission services. In some embodiments, the service provider facility may be connected to other service provider facilities as part of a service provider network. In some embodiments, a portable data center may be operated or owned by a party other than the service provider. In some embodiments, a portable data center may be used to transport large quantities of data between service provider facilities, between customer facilities, or between service provider facilities or customer facilities and facilities of a third party.

At 604, the received portable data center is coupled with computing devices of the service provider facility via a piece of networking equipment stowed in the portable data center and connected to computing devices of the portable data center via a tether cable. In some embodiments, 604 may be omitted and a portable data center may be connected to computing devices at a service provider facility via alternative means.

For example, at 606 instead of coupling the portable data center to a computing device of the service provider via a piece of networking equipment stowed in the portable data center, the portable data center is coupled to a computing device of the service provider facility via a separate connection. In some embodiments, a portable data center may include a network port that is configured to accept a connection from a service provider piece of equipment. For example, a service provider facility may include a cable coupled to computing devices of the service provider facility that is configured to be connected with a data port of the portable data center when the portable data center is at the service provider facility. In some embodiments, a wireless connection may be established between computing devices of the portable data center and a computing device of a service provider facility.

At 608, an encryption key for decrypting encrypted customer data stored on computing devices of the portable data center is received. The encryption key may be communicated or transferred to the service provider via a separate means other than the portable data center. For example, the encryption key may be stored in a separate device that is separately received at the service provider facility. In some embodiments, the encryption key may be generated and stored at the service provider facility without being communicated outside a network of the service provider. In some embodiments, the encryption key may be communicated to the service provider via a network connection.

At 610, encrypted customer data stored in computing devices of the portable data center is decrypted using the encryption key received at 608. In some embodiments, the encrypted customer data may have two levels of encryption. For example the encrypted customer data may have been encrypted with a line level encryption at a deployed piece of networking equipment before leaving a customer facility and may have been further encrypted by one or more computing devices of a portable data center before being stored in computing devices of the portable data center. Thus, 610 may include decrypting multiple layers of encryption.

At 612, decrypted customer data is stored in one or more computing devices of the service provider. In some embodiments, 610 may be omitted and encrypted customer data may be stored in one or more computing devices of the service provider without being decrypted. In such embodiments, a customer may retain an encryption key for decrypting the data in the future. In some embodiments, a customer may have a service agreement with the service provider to provide data storage services for the received customer data. In some embodiments, the service provider may operate a service provider network comprising multiple service provider facilities and the customer may have one or more computing or storage resources of the service provider network provisioned to the customer. In such embodiments, the received customer data may be stored on computing or storage resources of a provider network provisioned to the customer.

At 614, subsequent to storing the customer data in one or more computing devices of the service provider, customer data may be deleted from the computing devices of the portable data center. The deletion of the customer data from the computing devices of the portable data center may be performed in such a way that the customer data is no longer retrievable from the computing devices of the portable data center and cannot be recreated from any data stored in the computing devices of the portable data center.

At 616, the portable data center is disconnected from the service provider facility. In some embodiments, 616 may be performed before 614 above.

At 618, the portable data center is dispatched to another customer facility to transport large quantities of customer data from the other customer facility to the service provider facility. The portable data center may be transported to the other customer facility with computing devices already installed in racks of the portable data center.

Vibration Isolation Platform

In some embodiments, a portable data center may include a vibration isolation platform to prevent vibrations experienced by an outer structure of the portable data center from being fully transmitted to computing devices mounted within the portable data center. For example a portable data center may experience vibrations induced by road surfaces or uneven surfaces while being transported. Also, in the process of transporting a portable data center, the portable data center may experience one or more impacts such as travelling across a pot-hole, an uneven roadway, or from being loaded onto or off of a trailer. Without a vibration isolation platform, such vibrations and impacts may damage computing devices installed in a portable data center. Any of the portable data centers described above may include a vibration isolation platform.

In some embodiments, a portable data center may include a single vibration isolation platform or may include multiple vibration isolation platforms with subsets of computing devices of the portable data center mounted in racks on respective ones of the vibration isolation platforms of the portable data center.

Figure 7:
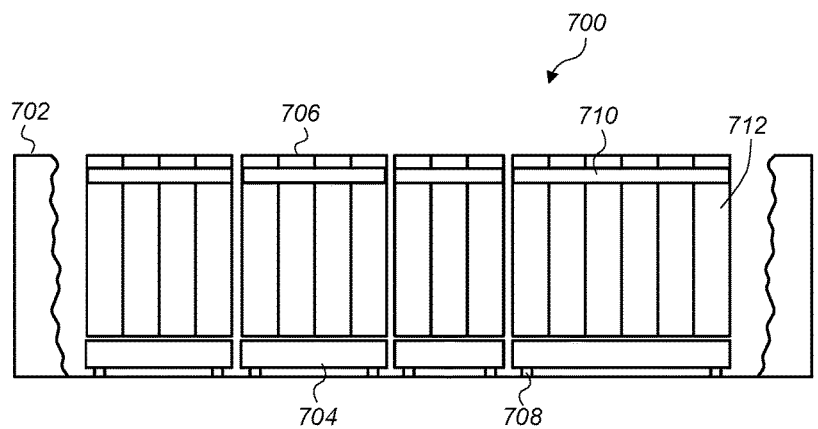
FIG. 7 illustrates a cutaway view of a compute space of a portable data center comprising vibration isolation platforms, according to some embodiments.

FIG. 7 illustrates a cutaway view of a compute space of a portable data center configured to be transported with installed computing devices comprising vibration isolation platforms, according to some embodiments. Portable data center 700 includes outer structure 702 and internal platforms 704 within outer structure 702 of portable data center 700. Computing devices 706 are mounted on platforms 704. In some embodiments, computing devices 706 are rack mounted computing devices mounted in racks coupled to respective ones of platforms 704. Vibration reduction devices 708 are mounted between platforms 704 and outer structure 702 of portable data center 700. In some embodiments, a portable data center may include a single platform within an outer structure. For example, in some embodiments computing devices 706 may be mounted on a single platform 704. In some embodiments, a portable data center may include multiple platforms 704 with respective sets of computing devices, such as computing devices 706 mounted on respective ones of the platforms 704, as illustrated in FIG. 7. In some embodiments, multiple platforms of a portable data center, such as platforms 704, may be coupled together via one or more structural members.

A vibration reduction device mounted between an internal platform of a portable data center and an outer structure of a portable data center, such as vibration reduction devices 708, may include air springs, a mechanical spring and dash-pot, an air cushion, a pneumatic damper, an actively controlled damping system, a polymer viscoelastic damping device, or other suitable device configured to dissipate vibrations. The vibration reduction device may prevent transmission of vibrations experienced by an outer structure of a portable data center from being transmitted to computing devices mounted on an internal platform of the portable data center that is separated from the outer structure of the portable data center via one or more vibration reduction devices.

In some embodiments, a portable data center, such as portable data center 700, may include structural members that couple racks of computing devices together such that in relation to vibrations, the coupled racks of computing devices behave as a common mass. For example, racks 712 comprising computing devices 706 are coupled together via structural members 710. Racks 712 of computing devices 706 may collectively behave as a common mass, e.g. the racks of computing device may move together, when vibrations are experienced by portable data center 700. In some embodiments, one or more vibration devices along with structurally coupled racks of computing devices may be configured to have a natural frequency that is at a different frequency than frequencies typically encountered when transporting a portable data center. For example, springs and dampers of a vibration reduction device may be selected to have spring constants and damping coefficients that when combined with a mass of computing devices to be installed on a platform of the portable data center result in a vibration system of the portable data center having a natural frequency far removed from common road induced vibration frequencies.

In some embodiments, a portable data center may include multiple types or configurations of vibration reduction devices. For example, a portable data center may include some vibration reduction devices configured to dissipate vibrations having vibration frequencies in a first frequency range and may include other vibration reduction devices configured to dissipate vibrations having vibration frequencies in a second frequency range that is at least partially different than the first vibration frequency range. For example, some vibration reduction devices may be configured to dissipate vibrations with vibration frequencies that correspond to vibrations induced by travelling on a road or track, and other vibration reduction devices may be configured to dissipate or absorb vibrations resulting from a sudden impact, such as an impact of a portable data center being loaded on a trailer, off-loaded off of a trailer, or an impact from a vehicle transporting a portable data center travelling across an uneven surface or drop-off.

Figure 8:
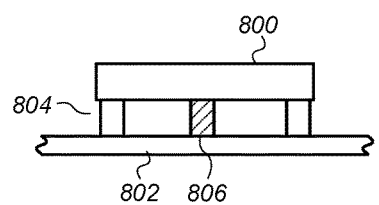
FIG. 8 illustrates a vibration isolation platform comprising to multiple vibration reduction devices, according to some embodiments.

FIG. 8 illustrates a vibration isolation platform comprising to multiple vibration reduction devices, according to some embodiments. Vibration reduction devices 804 and 806 are mounted between platform 800 and outer structure 802. In some embodiments, vibration reduction devices 804 may be configured to dissipate vibrations having frequencies corresponding to road induced vibrations. Whereas, vibration reduction device 806 may be configured to absorb sudden impacts, such as when a portable data center is loaded onto or off of a trailer. In some embodiments, vibration reduction devices 804 may be a particular type of vibration reduction device, and vibration reduction device 806 may be a different type of vibration reduction. In some embodiments, vibration reduction devices 804 and 806 may be similar types of vibration reduction devices that are tuned to perform different functions. For example, in some embodiments vibration reduction devices 804 may be air springs tuned for road induced vibrations, and vibration reduction device 806 may be an air spring tuned for lower frequency higher amplitude vibrations such as a sudden impact vibration. In some embodiments, vibration reduction devices 804 may be air springs tuned for road induced vibrations and a vibration reduction device 806 may be a different type of vibration reduction device, such as a mechanical spring and dash-pot, pneumatic damper, viscoelastic damper, or other type of vibration reduction device.

In some embodiments, a vibration reduction device may comprise a vibration cushion, such as an air cushion. An air cushion may include more working fluid, e.g. air, than some other types of vibration reduction devices, such as an air spring. Thus, an air cushion may have a greater capacity to absorb sudden impacts. For example, air in an air cushion may compress and some air in an air cushion may be expelled from the air cushion when an outer structure of a portable data center is impacted.

Figure 9A:
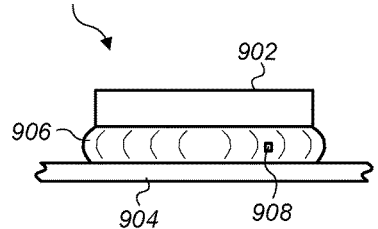
FIG. 9A illustrates a vibration isolation platform comprising a vibration cushion, according to some embodiments.

FIG. 9A illustrates a vibration isolation platform coupled with a vibration cushion, according to some embodiments. Vibration cushion 906 is mounted between platform 902 and outer structure 904. Vibration cushion 906 may be filled with a fluid, such as air. Also, a vibration cushion, such as vibration cushion 906, may include one or more valves such as valves 908. Valves 908 may allow air to be expelled from vibration cushion 906 when outer structure 908 is impacted. The force of an impact may be converted into work that pushes air out of the vibration cushion 906 and the full force of the impact may not be transmitted to platform 902 or an amplitude of the impact that is transmitted to platform 902 may be reduced or eliminated. Valves 908 may also allow air to be drawn into vibration cushion 906. For example, after an impact is experienced by outer structure 904 and after air is initially expelled from vibration cushion 908 to absorb the impact, air may be drawn back into vibration cushion 906 via valves 908. In some embodiments, an air pressure in a vibration cushion, such as cushion 906, may be adjusted to change a natural frequency of a system that includes a vibration isolation platform coupled with the vibration cushion. For example, increasing a pressure in a vibration cushion may increase a stiffness of the cushion, whereas reducing a pressure in a vibration cushion may reduce a stiffness of the cushion. In some embodiments, a vibration isolation platform may be coupled with multiple vibration cushions between the vibration isolation platform and an outer structure of a portable data center. For example, multiple cushions 908 may be coupled between platform 902 and outer structure 904. In some embodiments, different ones of multiple cushions between a vibration isolation platform and an outer structure of a portable data center may be configured with different air pressures such that an overall vibration isolation system that includes the multiple cushions has a natural frequency far removed from vibration frequencies that are expected to be encountered while transporting the portable data center.

Figure 9B:
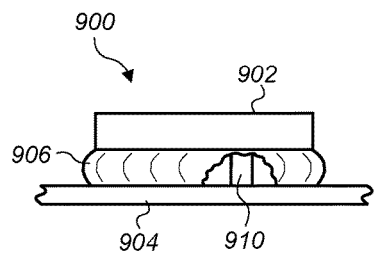
FIG. 9B illustrates a vibration isolation platform comprising a vibration cushion and an additional vibration reduction device, according to some embodiments.

FIG. 9B illustrates a vibration isolation platform coupled with a vibration cushion and an additional vibration reduction device, according to some embodiments.

In some embodiments, a vibration isolation platform of a portable data center may include a vibration cushion and another type of vibration reduction device, such as an air spring coupled with the same platform of the portable data center. For example, vibration isolation platform 900 includes vibration cushion 906 with air springs 910 mounted inside vibration cushion 906. Both vibration cushion 906 and air springs 910 are mounted between outer structure 904 and platform 902. Both vibration cushion 906 and air springs 910 reduce transmission of vibrations experienced by outer structure 904 from being transmitted to platform 902 and computing device mounted on platform 902. In some embodiments, air cushion 906 may be configured to absorb sudden impact vibrations whereas air springs 910 may be configured to dissipate road induced vibrations.

In some embodiments, a vibration isolation platform of a portable data center may be mounted above an air plenum and may include air vents that pass from the air plenum through a floor of the vibration isolation platform. In some embodiments, foam cushions may be mounted in a space between a vibration isolation platform and an outer structure of a portable data center to prevent air in a compute space of the portable data center from flowing into a space below a vibration isolation platform that is not part of an air plenum or air cooling system.

Figure 10:
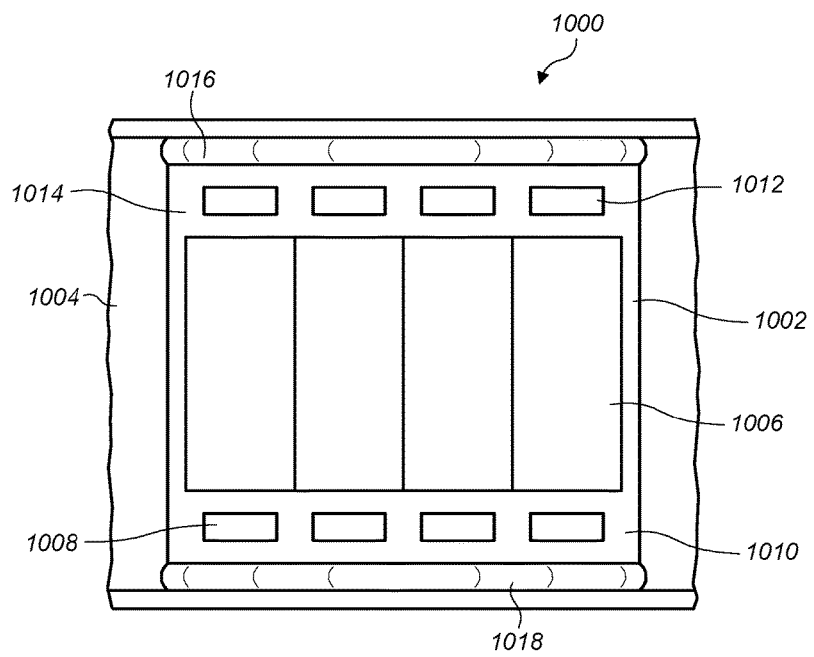
FIG. 10 illustrates a top view of a portion of a portable data center configured to be transported with installed computing devices comprising a vibration isolation platform, according to some embodiments.

FIG. 10 illustrates a top view of a portion of a portable data center configured to be transported with installed computing devices comprising a vibration isolation platform, according to some embodiments. Portable data center 1000 includes vibration isolation platform 1002 and outer structure 1004. Racks of computing devices 1006 are mounted on platform 1002. Vents 1008 pass through platform 1002 and allow air from an air plenum mounted between outer structure 1004 and platform 1002 to be directed into cold aisle 1010 on a first side of racks of computing devices 1006. Vents 1012 pass through platform 1002 and allow air in hot aisle 1014 to be drawn into an air plenum mounted between outer structure 1004 and platform 1002. In some embodiments, a portable data center, such as portable data center 1000, may include foam barriers, such as foam barriers 1016 and 1018, between a side of a platform, such as platform 1002, and an outer structure of the portable data center, such as outer structure 1004. The foam barriers may be flexible such that the platform is free to move relative to the outer structure while preventing air in a hot aisle or cold aisle from flowing into a space outside of the hot aisle or cold aisle. In some embodiments, foam barriers (not shown) may be mounted above racks of computing devices, such as racks of computing devices 1006 and a ceiling of a compute space of a portable data center. Foam barriers mounted above racks of computing devices may allow the computing devices and platform to move in a vertical direction while also preventing air from flowing between a hot aisle and cold aisle via a space above a rack.

In some embodiments, vibration reduction devices of a portable data center may be actively controlled to reduce vibrations experienced by computing devices of a portable data center or to ensure vibrations experienced by computing devices of a portable data center do not exceed a threshold level of vibrations.

Figure 11:
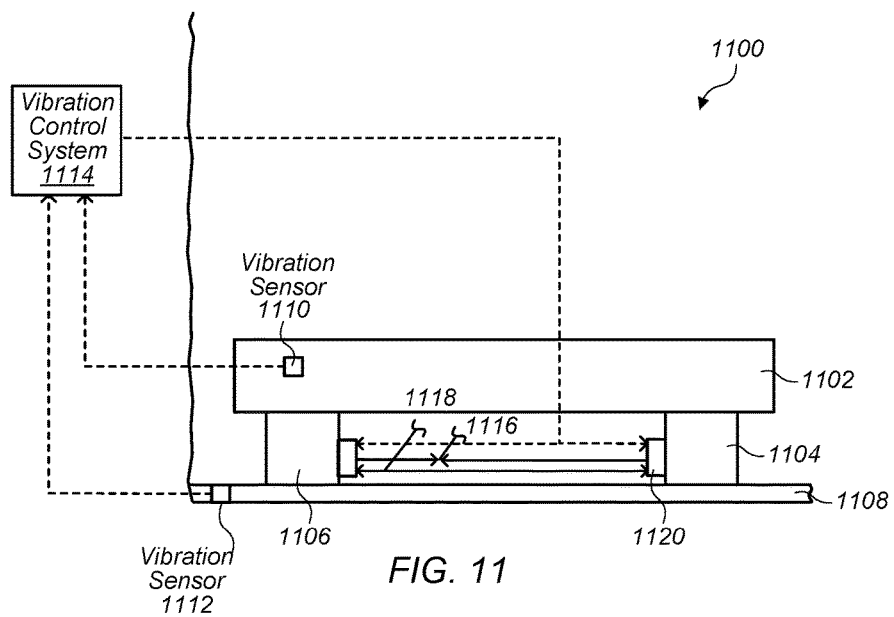
FIG. 11 illustrates a vibration isolation platform comprising an actively controlled vibration reduction device, according to some embodiments.

FIG. 11 illustrates a vibration isolation platform comprising an actively controlled vibration reduction device, according to some embodiments. Vibration isolation platform 1100 includes platform 1102 and vibration reduction devices 1104 and 1106 mounted between platform 1102 and outer structure 1108. A vibration sensor 1110 is mounted on platform 1102 and a vibration sensor 1112 is mounted on outer structure 1108. In some embodiments, an actively controlled vibration isolation platform may include a vibration control system, such as vibration control system 1114, that receives vibration measurements from vibration sensors, such as vibration sensors 1110 and 1112. In some embodiments, a vibration control system may be implemented in a vibration reduction device, such as vibration reduction device 1104 or 1106 or may be included in a common control system that controls support equipment of a portable data center. In some embodiments, vibration reduction devices 1104 and 1106 may include pneumatic or hydraulic dampers, and vibration control system 1114 may receive vibration measurements from vibration sensors 1110 and 1112 and adjust a pneumatic or hydraulic pressure in vibration reduction devices 1104 and 1106 based, at least in part, on the received vibration measurements. Changing a pneumatic or hydraulic pressure in vibration reduction devices 1104 and 1106 may have the effect of making the vibration reduction devices stiffer, i.e. changing a spring constant of the vibration reduction devices, or may have the effect of changing a damping coefficient of the vibration reduction devices. Vibration reduction devices 1104 and 1106 may be coupled to fluid supply line 1116 and fluid return line 1118 via valves 1120. Vibration control system 1114 may cause valves 1120 to open and close in order to adjust vibration reduction devices 1104 and 1106. In some embodiments, an actively controlled vibration isolation platform may use a hydraulic fluid or different fluid other than a hydraulic fluid. For example, a pneumatic actively controlled vibration isolation system may use air as a working fluid. In some embodiments, a vibration cushion filled with air may be actively controlled. Also, in some embodiments, a vibration isolation platform may include magnetic bearings that are actively controlled via a vibration control system, such as vibration control system 1114. In some embodiments, a vibration isolation platform may include various other types of actively controlled vibration reduction devices.

Figure 12:
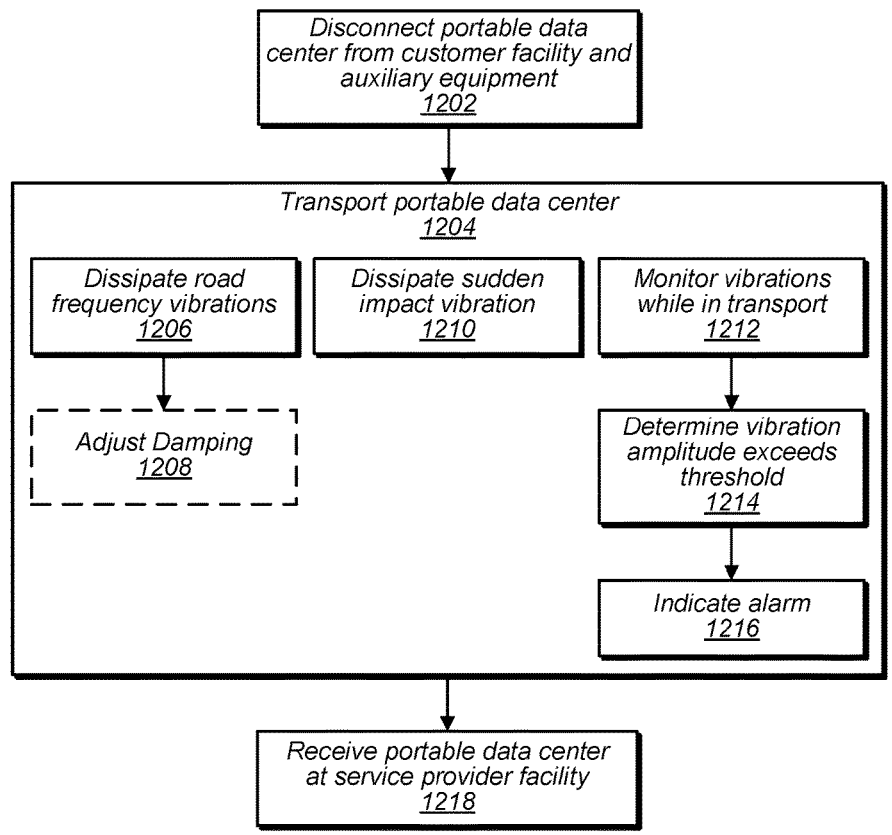
FIG. 12 illustrates a method of reducing vibrations experienced by computing devices of a portable data center configured to be transported with installed computing devices when transporting the portable data center, according to some embodiments.

FIG. 12 illustrates a method of reducing vibrations experienced by computing devices of a portable data center configured to be transported with installed computing devices when transporting the portable data center, according to some embodiments.

At 1202 a portable data center is disconnected from a customer facility and auxiliary equipment that may be coupled to the portable data center. For example, a tethered piece of networking equipment may have been connected to a computing device of a customer facility and at 1202 the tethered piece of networking equipment may be disconnected from the customer facility and stowed in a storage compartment of the portable data center. Also, in some embodiments, auxiliary equipment such as a generator or chilled water cooling system such as a mechanical chiller, may have been coupled to the portable data center and at 1202 may be disconnected from the portable data center. In some embodiments, 1202 may take place after customer data has been stored on computing devices of a portable data center and it is determined that the portable data center is to be transported to another location, such as a service provider facility.

At 1204, the portable data center is transported to a second location from a first location, for example to a service provider facility from a customer facility. In some embodiments transporting the portable data center includes one or more of 1206-1216. At 1206, while the portable data center is being transported, road frequency vibrations are dissipated by a vibration reduction device of a portable data center. In some embodiments, at 1208, the vibration reduction device may be adjusted. For example, in some embodiments a vibration reduction device may be part of an active vibration control system and a damping coefficient, or spring coefficient of the vibration reduction device may be actively adjusted based on sensed vibration measurements while a portable data center is being transported. In some embodiments, 1208 may be omitted.

At 1210, while the portable data center is being transported, sudden impact vibrations are dissipated or absorbed by one or more vibration reduction devices of a portable data center. For example, the portable data center may include a vibration cushion that absorbs sudden impact vibrations. In some embodiments, a portable data center may include a hybrid vibration reduction system that includes some vibration reduction devices configured to dissipate road frequency vibrations and other vibration reduction devices configured to absorb sudden impact vibrations.

At 1212, while the portable data center is being transported, a vibration control system, or other monitoring system of the portable data center may monitor vibrations. Vibrations may be monitored at one or more computing devices mounted in racks coupled with a vibration isolation platform, may be monitored at the vibration isolation platform, or may be monitored in another location such as an outer structure of the portable data center. At 1214, while the portable data center is being transported, including loading of the portable data center on a vehicle for transportation, it is determined if amplitudes of monitored vibrations exceed one or more thresholds. For example, a threshold for a sudden impact vibration may be if an acceleration of the computing devices exceed a particular amount. In another example, a threshold for road frequency vibrations may be if vibrations within a particular frequency range have amplitudes that exceed a threshold amount or exceed a threshold amount for a threshold time period. At 1216, while transporting the portable data center, in response to determining vibration amplitudes have exceeded one or more thresholds, an alarm indication may be given. In some embodiments, an alarm indication may be sent from a building management system of a portable data center to a remote service provider facility. In some embodiments, an alarm may be communicated to an operator of a vehicle transporting the portable data center. For example, a text message may be sent to an operator of the vehicle transporting the portable data center. In some embodiments, an alarm may be indicated on a display of a vehicle transporting the portable data center.

At 1218, the portable data center is received at a second location, such as a service provider facility. In some embodiments, computing devices may be inspected when the portable data center arrives at a service provider facility in response to an alarm that indicated vibrations on the portable data center exceeded one or more thresholds. Once received at a service provider facility, customer data stored on computing devices of the portable data center may be transferred to computing devices of the service provider as described above in regard to FIG. 6.

Cooling System

In some embodiments, a portable data center may include a cooling system configured to remove waste heat from computing devices and transfer the waste heat to a heat rejection portion of the portable data center. The heat rejection portion of the portable data center may include additional pieces of heat producing equipment, such as a transformer, and may be configured to reject waste heat from the heat rejection portion of the portable data center into an ambient environment external to the portable data center. In some embodiments, at least a portion of a cooling system for computing devices of a portable data center may be mounted in a sub-floor space between a platform of the portable data center, such as any of the vibration isolation platforms discussed in FIGS. 1-19 and a floor of an outer structure of a portable data center such as discussed in FIGS. 1-19. In some embodiments, a cooling system of a portable data center may cool computing devices of the portable data center without a mechanical cooling system being installed in the portable data center. In some embodiments, when in high temperature climates or when experiencing high workloads, a chilled water system may be coupled to a cooling circuit of a cooling system of a portable data center to augment the cooling capacity of the portable data center. In some embodiments, a vibration isolation platform of a portable data center may move independent of an outer structure of the portable data center and a cooling system of the portable data center may be configured to not restrict movement of the vibration isolation platform relative to the outer structure of the portable data center.

Figure 13:
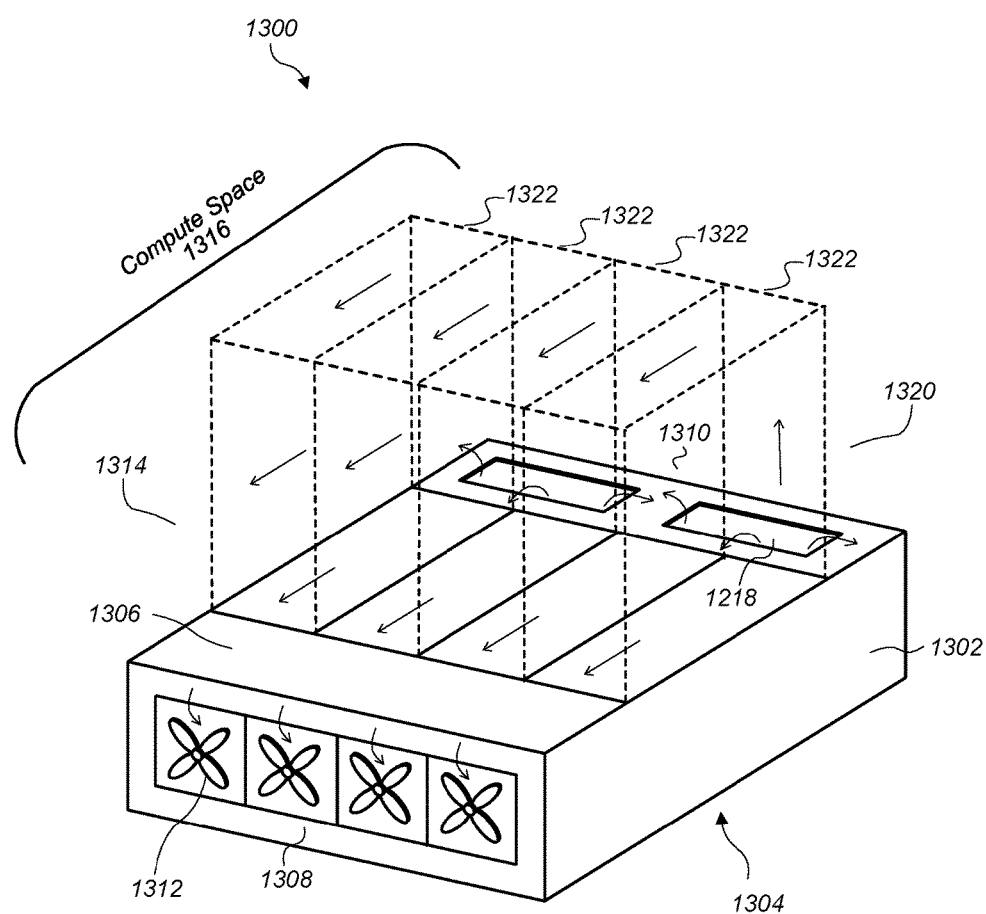
FIG. 13 illustrates a perspective view of a vibration isolation platform of a portable data center comprising a sub-floor cooling system, according to some embodiments.

FIG. 13 illustrates a perspective view of a vibration isolation platform of a portable data center configured to be transported with installed computing devices comprising a sub-floor cooling system, according to some embodiments.

Portable data center 1300 includes vibration isolation platform 1302 and cooling system 1304 mounted below platform 1306 of vibration isolation platform 1302. Cooling system 1304 includes one or more air plenums running beneath platform 1306. The air plenums include an inlet end 1308 and outlet ends 1310. Air moving devices 1312 are mounted near inlet end 1308 and draw air from hot aisle 1314 of compute space 1316 of portable data center 1300 into the one or more air plenums. Air vents 1318 are mounted at outlet end 1310 of the one or more sub-floor air plenums and pass through platform 1306. Air vents 1318 may permit air that has been cooled by cooling system 1304 to be directed into cold aisle 1320 of compute space 1316 of portable data center 1300. Cool air in cold aisle 1320 may pass through racks 1322 and may remove waste heat from computing devices mounted in racks 1322. Heated air that has removed waste heat from computing devices in racks 1322 may be directed into hot aisle 1314 and drawn into one or more of the one or more air plenums of cooling system 1304 to be cooled and returned to cold aisle 1320 as cool air. Any of the portable data centers described above in FIGS. 1-19 may include a sub-floor cooling system as described in regard to FIGS. 13-19.

Figure 14:
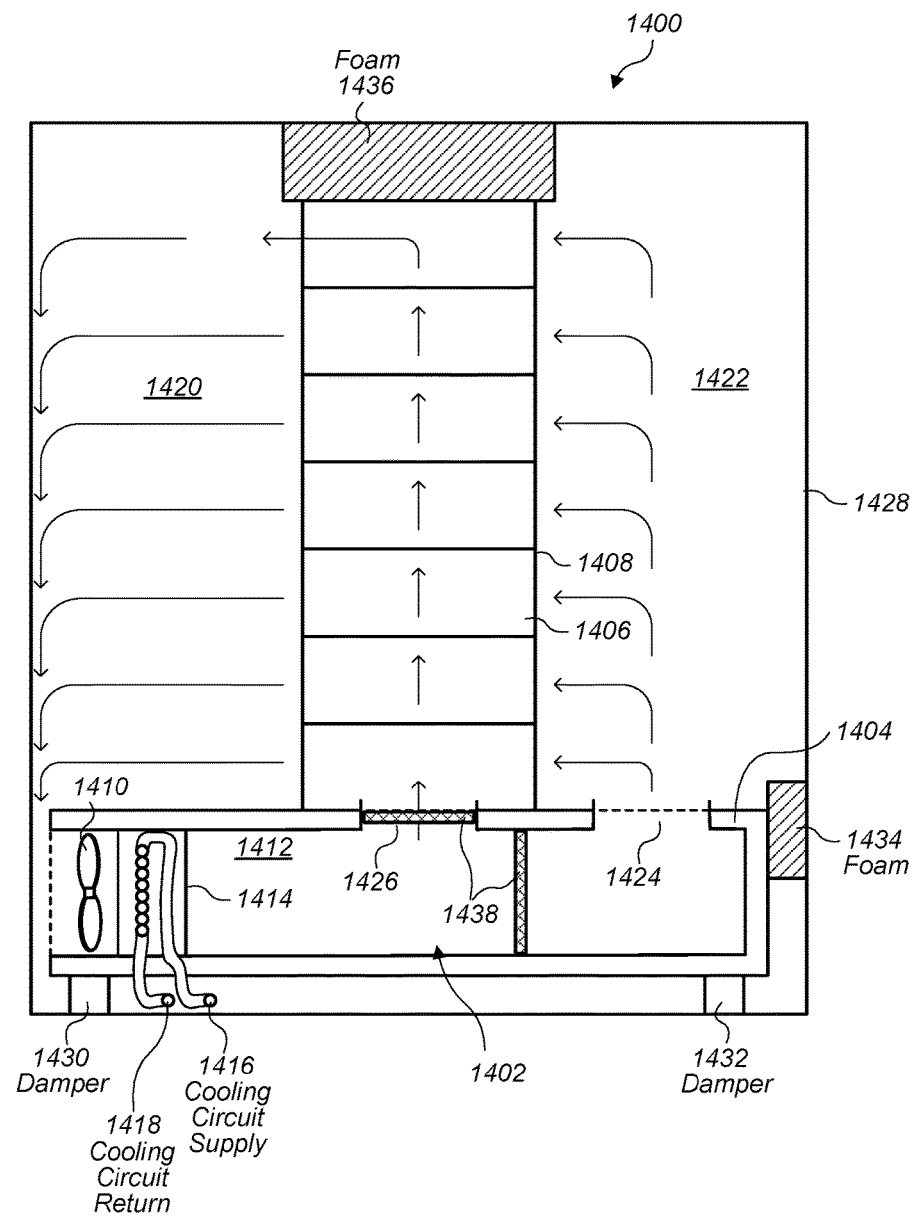
FIG. 14 illustrates a side view of a vibration isolation platform of a portable data center comprising a sub-floor cooling system, according to some embodiments.

FIG. 14 illustrates a side view of a vibration isolation platform of a portable data center comprising a sub-floor cooling system, according to some embodiments. Portable data center 1400 illustrated in FIG. 14 may be the same as portable data center 1300 illustrated in FIG. 13.

Portable data center 1400 includes a sub-floor cooling system 1402, a vibration isolation platform 1404, and computing devices 1406 mounted in rack 1408. Rack 1408 is mounted on vibration isolation platform 1404. Sub-floor cooling system 1402 includes air moving devices 1410, air plenum 1412, and heat exchanger 1414 connected to cooling circuit supply 1416 and cooling circuit return 1418.

An air moving device of a sub-floor cooling system, such as air moving devices 1410 of sub-floor cooling system 1402, may draw air into an air plenum of the sub-floor cooling system from a hot aisle of a compute space above the sub-floor cooling system. For example, air moving devices 1410 may draw air from hot aisle 1420 into air plenum 1412. Air drawn into an air plenum from a hot aisle may flow across a portion of a cooling circuit, such as a heat exchanger coupled to the cooling circuit. A heat exchanger of a cooling circuit may include coils, fins, tubes, or other suitable heat exchanger designs configured to exchange heat between a cooling fluid and air. For example, air drawn into air plenum 1412 by air moving devices 1410 may pass across heat exchanger 1414. Heat exchanger 1414 may be coupled to a cooling circuit that circulates a heat transfer fluid such as water, glycol, oil, or some other suitable heat transfer fluid. A heat transfer fluid may flow into heat exchanger 1414 via cooling circuit supply 1416 that is connected to a cooling circuit and may return to the cooling circuit after absorbing heat from air passing through air plenum 1412 via cooling circuit return 1418. Cool air flowing through an air plenum that has passed through a heat exchanger may flow into a cold aisle of a compute space above a sub-floor cooling system via one or more air vents. For example, air that has passed across heat exchanger 1414 may flow into cold aisle 1422 via vent 1424. In some embodiments, air that has passed across a heat exchanger may flow directly into a rack to cool heat producing components mounted in the rack. For example, some of the air that has passed across heat exchanger 1414 may flow into rack 1408 via vent 1426 and cool computing devices 1406 mounted in rack 1408. Also, air in cold aisle 1422 may be drawn into rack 1408 and cool computing devices 1406 mounted in rack 1408. Air that has removed waste heat from computing devices 1406 in rack 1408 may be exhausted into hot aisle 1420 and subsequently drawn back into sub-floor cooling system 1402 to be cooled and returned to cold aisle 1422. In some embodiments, a sub-floor cooling system, such as sub-floor cooling system 1402, may not include a vent that flows directly into a rack, such as vent 1424, and may direct cooled air into a cold aisle via one or more vents into the cold aisle, such as vents 1424, without using a vent placed below a rack, such as vent 1426.

In some embodiments, a sub-floor cooling system may be configured to not restrict movement of a vibration isolation platform, such as vibration isolation platform 1404, relative to an outer structure of a portable data center, such as outer structure 1428. For example, sub-floor cooling system 1402 is mounted in an overall structure of vibration isolation platform 1404 that is supported by dampers 1430 and 1432. Because sub-floor cooling system 1402 is coupled with the structure of vibration isolation platform 1404, sub-floor cooling system 1402 may move with vibration isolation platform 1404 when the vibration isolation platform moves relative to outer structure 1428 without inhibiting motion of the vibration isolation platform. In some embodiments connections from a sub-floor cooling system to a cooling circuit may be flexible connections, such as flexible hoses. For example, connections to cooling circuit supply 1416 and cooling circuit return 1418 may be flexible connections. Also, in some embodiments, foam barriers may be used to seal a cold aisle from a hot aisle in a compute space cooled by a sub-floor cooling system. Foam barriers may inhibit air from flowing between a cold aisle and hot aisle through air passages that bypass computing devices to be cooled by the sub-floor cooling system. Foam barriers may also allow freedom of movement for a vibration isolation platform to move relative to an outer structure of a portable data center. For example, foam block 1434 is mounted between vibration isolation platform 1404 and outer structure 1428 to prevent cold air in cold aisle 1422 from flowing into a space below cold aisle 1422. Foam block 1434 may also be flexible such that vibration isolation platform 1404 is free to move vertically relative to outer structure 1428 and its motion may not be significantly inhibited by foam block 1434. In another example, foam block 1436 is mounted between racks 1408 and a ceiling of outer structure 1428. Foam block 1436 may prevent cold air in cold aisle 1422 from bypassing computing devices 1406 mounted in rack 1408 and flowing into hot aisle 1420. Foam block 1436 may also compress and expand to allow rack 1408 to move with vibration isolation platform 1404 relative to outer structure 1428. In some embodiments, a sub-floor cooling system, such as sub-floor cooling system 1402, may include air filters to remove particles from air passing through an air plenum of the sub-floor cooling system. For example, air plenum 1412 includes air filters 1438.

FIG. 14 illustrates a sub-floor cooling system that is configured to move with a vibration isolation platform. In some embodiments, a sub-floor cooling system may be coupled to an outer structure of a portable data center and may include one or more flexible ducts configured to allow a vibration isolation platform to move relative to the sub-floor cooling system coupled to the outer structure of a portable data center as described in more detail below in regard to FIG. 16.

Figure 15:
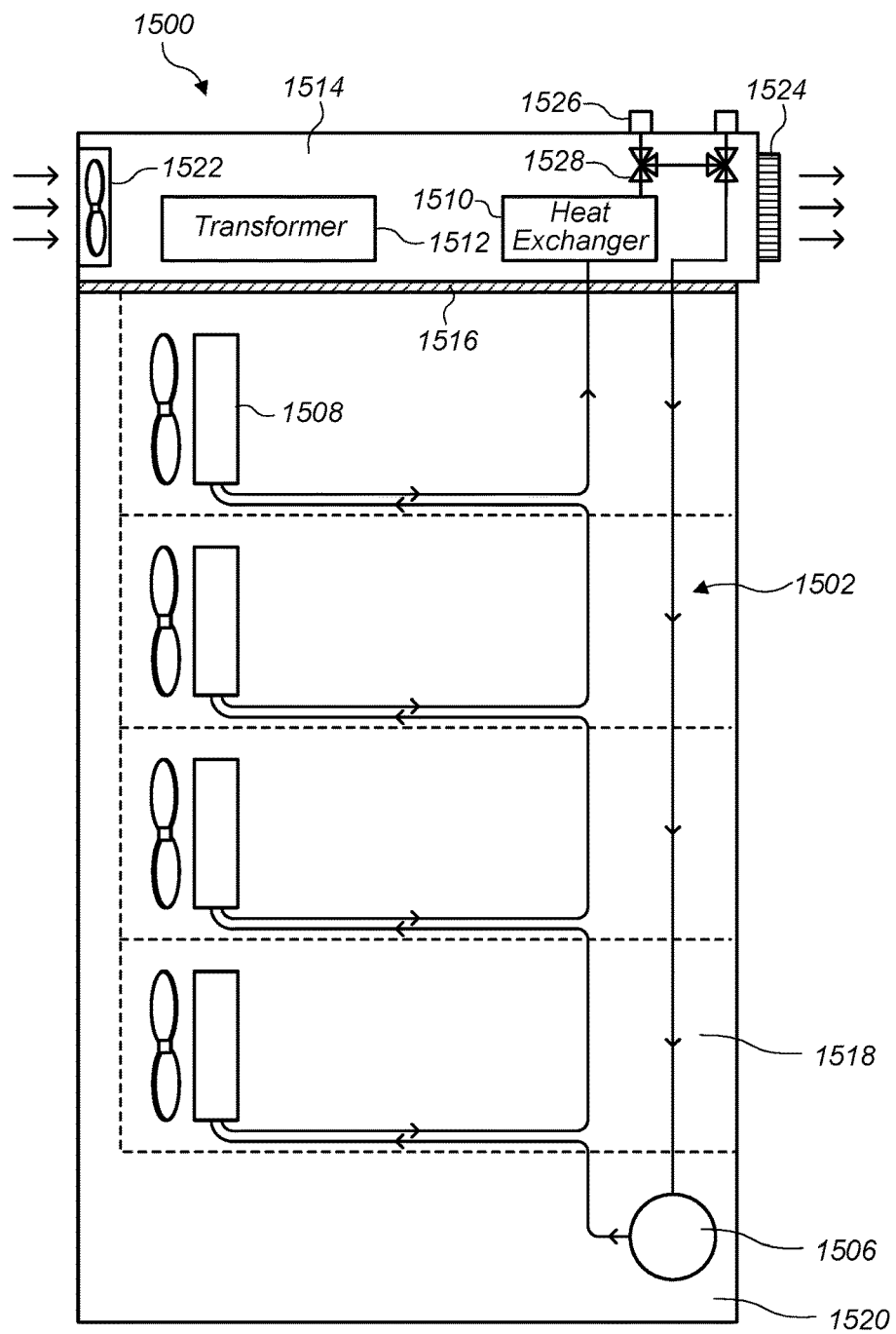
FIG. 15 illustrates a cooling circuit of a portable data center, according to some embodiments.

FIG. 15 illustrates a cooling circuit of a portable data center, according to some embodiments. Cooling circuit 1502 may be a cooling circuit as discussed above in regard to FIG. 14. Cooling circuit 1502 includes a fluid moving device, such as pump 1506, and heat exchangers 1508 and a heat rejection heat exchanger, such as heat exchanger 1510. Each of heat exchangers 1508 are positioned in an air flow of an air plenum of a sub-floor cooling system, such as air plenum 1412 of sub-floor cooling system 1402 described in regard to FIG. 14. A heat transfer fluid, such as water, glycol, oil, or other suitable heat transfer fluid is circulated through cooling circuit 1502 via pump 1506. The heat transfer fluid may pass through heat exchangers 1508 and absorb heat from air passing through the heat exchangers 1508 to cool the air. Subsequent to absorbing waste heat from heat exchangers positioned in one or more air plenums, the heat transfer fluid may pass through a heat rejection heat exchanger, such as heat exchanger 1510. The heat rejection heat exchanger may be located in a heat rejection portion of a portable data center along with other pieces of heat producing equipment, such as transformer 1512. In some embodiments, a heat rejection portion of a portable data center may be thermally insulated from other portions of the portable data center. For example, insulation 1516 thermally insulates heat rejection portion 1514 of portable data center 1500 from compute space 1518. Also, in some embodiments, a fluid moving device of a cooling circuit, such as pump 1506, may be located in a portion of a portable data center that is separate from a compute space of the portable data center. For example, pump 1506 is located in equipment and control portion 1520 of portable data center 1500.

In some embodiments, a heat rejection portion of a portable data center, such as heat rejection portion 1514, may include an air moving device, such as fan 1522, and one or more vents, such as vent 1524. An air moving device coupled to a heat rejection portion may cause heated air from a heat rejection portion of a portable data center to be exhausted to an external environment and may cause cooler ambient air to be drawn into the heat rejection portion of the portable data center. For example, fan 1522 may cause ambient air to be drawn into heat rejection portion 1514 and cause the air to flow across heat exchanger 1510 and transformer 1512 and be exhausted to an external environment via vent 1524.

In some embodiments, a cooling circuit may include connectors configured to couple the cooling circuit with an auxiliary cooling system to augment a capacity of the cooling circuit to remove waste heat from air passing through air plenums of a sub-floor cooling system. For example cooling circuit 1502 includes connectors 1526 and valves 1528 configured to couple an auxiliary cooling system, such as a mechanical chiller or customer chilled water system, to cooling circuit 1502. In some situations, ambient conditions at a location at which a portable data center is being operated may necessitate additional cooling capacity. Also, in some circumstances, a load placed on computing devices of portable data center may be such that additional cooling capacity is needed to cool the computing devices of the portable data center. In such circumstances an auxiliary cooling system coupled to a cooling circuit may augment the cooling circuit's capacity to absorb waste heat. For example, a heat transfer fluid may flow through a mechanical chiller after passing through heat exchanger 1510 to further cool the heat transfer fluid before the heat transfer fluid flows through sub-floor cooling systems to absorb waste heat. In some embodiments, a heat transfer fluid may be water and connectors 1526 and valves 1528 may be used to couple a cooling circuit of a portable data center to a chilled water system at a location at which the portable data center is being operated. In some embodiments, connectors 1526 may be quick release fittings such as cam-lock fittings or other suitable types of connectors for coupling an auxiliary cooling system to a cooling circuit.

Figure 16A:
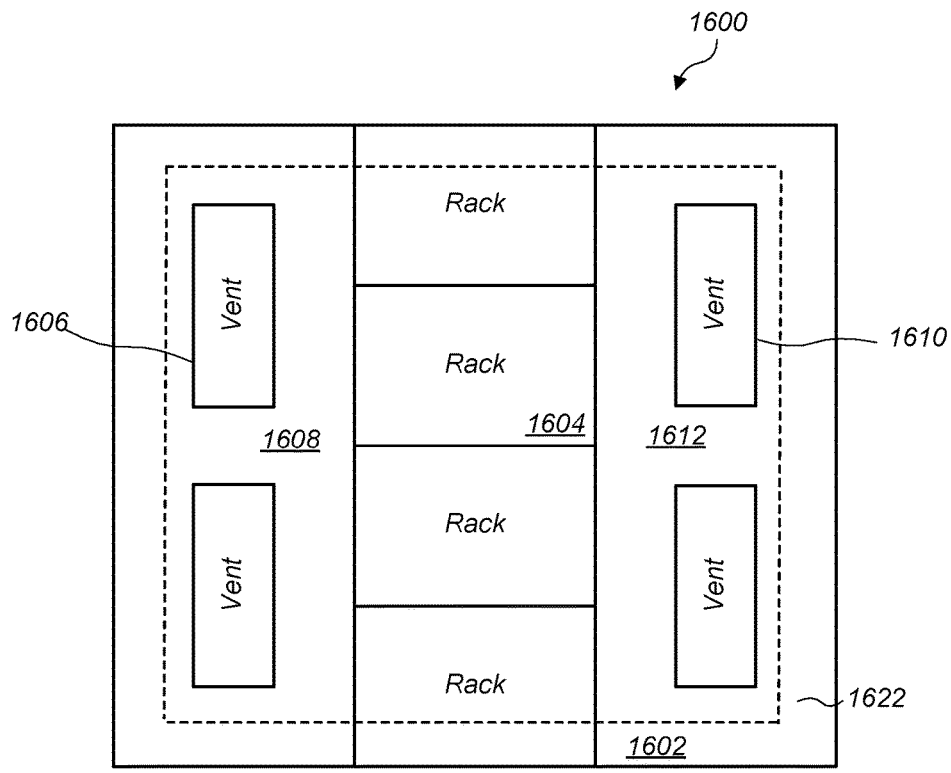
FIG. 16A illustrates a top view of a vibration isolation platform of a portable data center comprising a sub-floor cooling system, according to some embodiments.
Figure 16B:
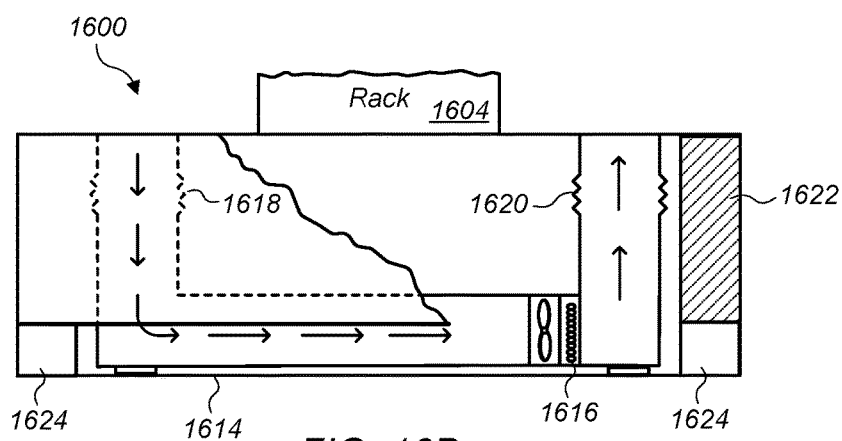
FIG. 16B illustrates a side view of a vibration isolation platform of a portable data center comprising a sub-floor cooling system, according to some embodiments.

FIG. 16A illustrates a top view of a vibration isolation platform of a portable data center comprising a sub-floor cooling system, according to some embodiments, and FIG. 16B illustrates a side view of a vibration isolation platform of a portable data center comprising a sub-floor cooling system, according to some embodiments. As shown in FIG. 16A, racks 1604 of computing devices are mounted on vibration isolation platform 1602 and vents 1606 are located in hot aisle 1608 and vents 1610 are located in cold aisle 1612. As illustrated in FIG. 16B, air plenum 1616 is mounted on outer structure 1614 of portable data center 1600 and includes expansion connections 1618 and 1620 configured to expand and contract as vibration isolation platform 1602 moves up and down vertically relative to outer structure 1614 of portable data center 1600. In some embodiments, expansion connections 1618 and 1620 may be bellows, such as rubber or polymer bellows. In some embodiments, vibration isolation platform 1602 may include structural members 1622 along a perimeter of vibration isolation platform 1602 that engage with dampers 1624 to dissipate vibrations experienced by outer structure 1614. Such an arrangement may include an open space beneath vibration isolation platform 1602 in which a sub-floor cooling system is mounted.

In some embodiments, an inlet to a sub-floor cooling system may be located in an elevated position in a hot aisle. Such an arrangement may improve air circulation through a compute space of a portable data center.

Figure 17:
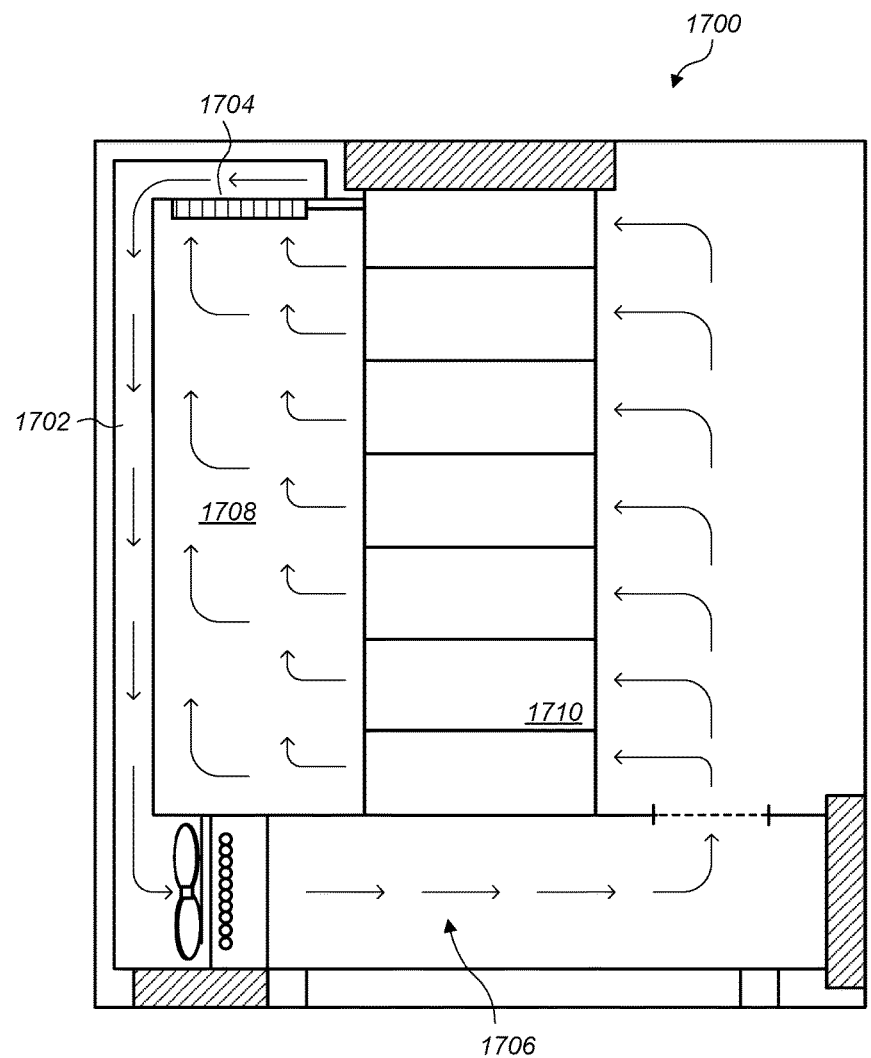
FIG. 17 illustrates a side view of a vibration isolation platform of a portable data center comprising a sub-floor cooling system, according to some embodiments.

FIG. 17 illustrates a side view of a vibration isolation platform of a portable data center comprising a sub-floor cooling system, according to some embodiments. Portable data center 1700 includes air duct 1702 that connects an inlet to sub-floor cooling system 1706 to elevated inlet vent 1704 located in an elevated position in hot aisle 1708. Elevated air vent 1704 may prevent preferential flow of air being drawn into sub-floor cooling system 1706 that causes computing devices in lower positions in rack 1710 to receive more airflow that computing devices in upper positions in rack 1710.

Figure 18A:
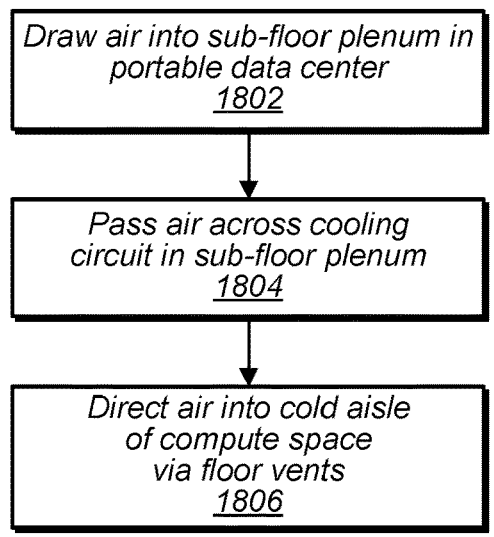
FIG. 18A illustrates a method of cooling computing devices of a portable data center configured to be transported with installed computing devices, according to some embodiments.
Figure 18B:
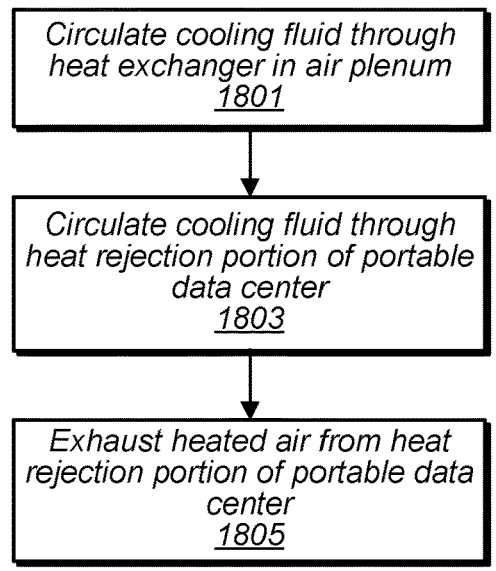
FIG. 18B illustrates a method of cooling computing devices of a portable data center configured to be transported with installed computing devices, according to some embodiments.

FIGS. 18A-B illustrate a method of cooling computing devices of a portable data center configured to be transported with installed computing devices, according to some embodiments.

At 1802, air is drawn into an air plenum of a sub-floor cooling system in a portable data center. The sub-floor cooling system may include one or more air moving devices that cause the air to be drawn into the air plenum from a hot aisle of a compute space located above the sub-floor cooling system. In some embodiments, air may be drawn into the air plenum of the sub-floor cooling system via floor tile vents in a platform of a vibration isolation platform or may be drawn into vents on a side of a vibration isolation platform and may pass through a space between the side of the vibration isolation platform and an outer structure of a portable data center to reach the vents on the side of the vibration isolation platform.

At 1804, air that has been drawn into an air plenum of a sub-floor cooling system passes across a portion of cooling circuit circulating a heat transfer fluid. The portion of the cooling circuit may include a heat exchanger mounted in the air plenum.

At 1806, air flowing through an air plenum of a sub-floor cooling system that has been cooled by passing across a portion of cooling circuit is directed into a cold aisle of a compute space of a portable data center. The cool air may then pass across heat producing components of computing devices mounted in the compute space to remove waste heat from the heat producing components of the computing devices of the compute space. Subsequent to removing waste heat from heat producing components of computing devices in a compute space, the air may flow into a hot aisle of the compute space and be drawn back into the sub-floor cooling system from the hot aisle of the compute space.

At the same time as 1802, 1804, and 1806, a heat transfer fluid may be circulated through a cooling circuit of a sub-floor cooling system. At 1801, a heat transfer fluid is circulated through a heat exchanger mounted in an air plenum of a sub-floor cooling system. Heat energy in air passing through the air plenum may be transferred to the heat transfer fluid flowing through the cooling circuit to cool the air passing through the air plenum.

At 1803, the heat transfer fluid is circulated through a separate heat exchanger of the cooling circuit that is located in a heat rejection portion of a portable data center. The heat exchanger in the heat rejection portion of the portable data center may exchange heat energy from the heat transfer fluid with air passing through the heat rejection portion of the portable data center to cool the heat transfer fluid. In some embodiments, an auxiliary cooling system may be coupled to a cooling circuit and the heat transfer fluid may pass through an auxiliary cooling system in addition to or in place of passing through a heat exchanger located in a heat rejection portion of a portable data center.

At 1805, air in the heat rejection portion of the portable data center that has received thermal energy from the heat exchanger of the cooling circuit located in the heat rejection portion of the portable data center and/or from one or more other pieces of heat producing equipment located in the heat rejection portion of the portable data center, may be expelled from the portable data center via one or more air moving devices and vents. Ambient cool air may also be drawn into the heat rejection portion of the portable data center to remove additional heat from equipment located in the heat rejection portion of the portable data center.

Figure 19:
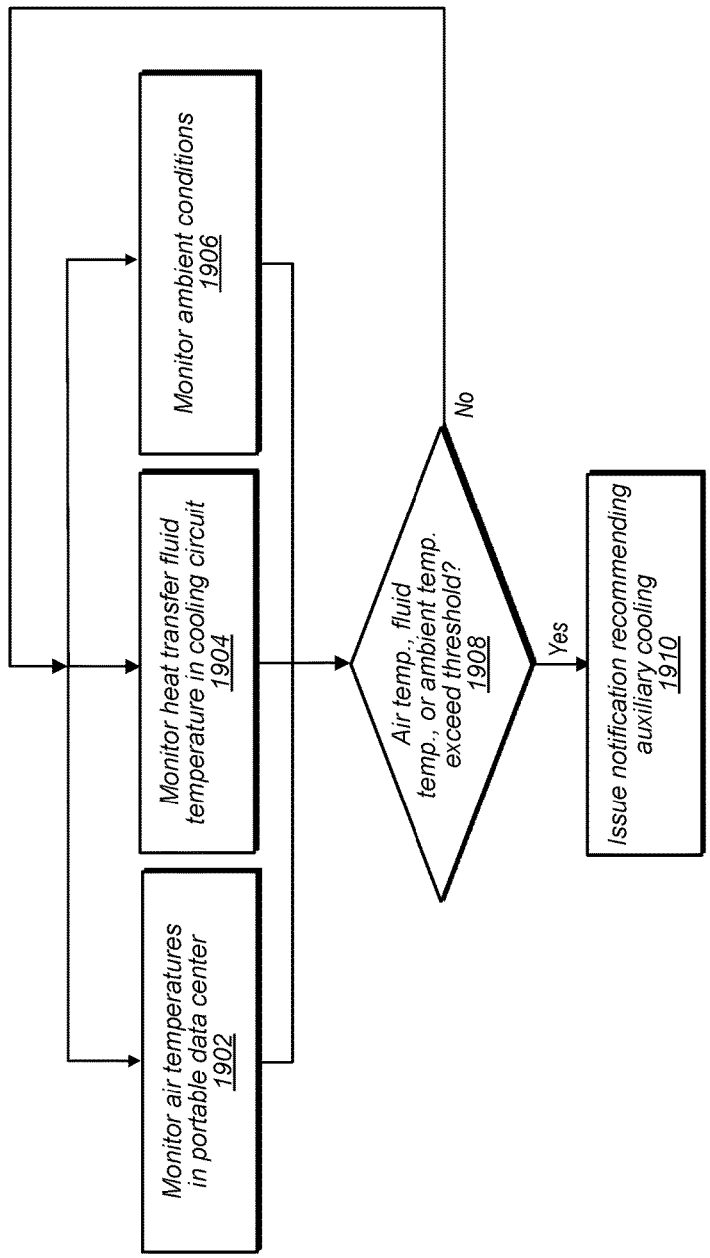
FIG. 19 illustrates a method of operating a cooling circuit of a portable data center configured to be transported with installed computing devices, according to some embodiments.

FIG. 19 illustrates a method of operating a cooling circuit of a portable data center configured to be transported with installed computing devices, according to some embodiments.

In some embodiments, a cooling circuit of a portable data center, air within the portable data center, and ambient conditions may be monitored by a management system of a portable data center. These different temperatures may be monitored concurrently or intermittently. At 1902, air temperatures in a portable data center are monitored. Monitoring air temperatures in the portable data center may include monitoring an air temperature of a cold aisle in the portable data center, a hot aisle in the portable data center, or an air temperature of a heat rejection portion of the portable data center. In some embodiments, other air temperatures may be monitored. In some embodiments thermocouples or resistance temperature devices RTDs may be used to monitor temperatures in the portable data center. In some embodiments, virtual sensors that estimate temperatures based on other measured quantities may be used to monitor temperatures in a portable data center.

At 1904, a temperature of a heat transfer fluid in a cooling circuit of the portable data center is monitored. The temperature of the heat transfer fluid may also be monitored using thermocouples, RTDs, virtual sensors, or other suitable temperature measuring devices. In addition, at 1906 ambient air conditions at a location at which the portable data center is located are monitored. In some embodiments, thermocouples, RTDs, virtual sensors, or other suitable temperature measuring devices may be used to monitor ambient conditions. In some embodiments, information about ambient conditions may be received from a remote location such as published weather information or weather reports publicly available. In some embodiments, monitoring ambient air conditions may include receiving weather information for one or more days into the future, such as in a weather forecast, and predicting ambient conditions based on the weather forecast.

At 1908, it is determined if air temperatures, heat transfer fluid temperatures, or ambient temperatures exceed one or more thresholds. In some embodiments, the determination at 1908 may be performed based on predicted temperatures, such as predicted ambient air temperatures included in a weather forecast. At 1910, in response to determining that an air temperature, heat transfer fluid temperature, or ambient temperature exceeds or is likely to exceed one or more thresholds, a notification is issued recommending auxiliary cooling be coupled with the cooling circuit. If one or more thresholds are not exceeded, the system reverts to 1902, 1904, and 1906 and continues to perform temperature monitoring. In some embodiments, 1910 may be omitted and a determination to couple auxiliary cooling to a cooling circuit may be performed without issuing a notification.

Figure 20:
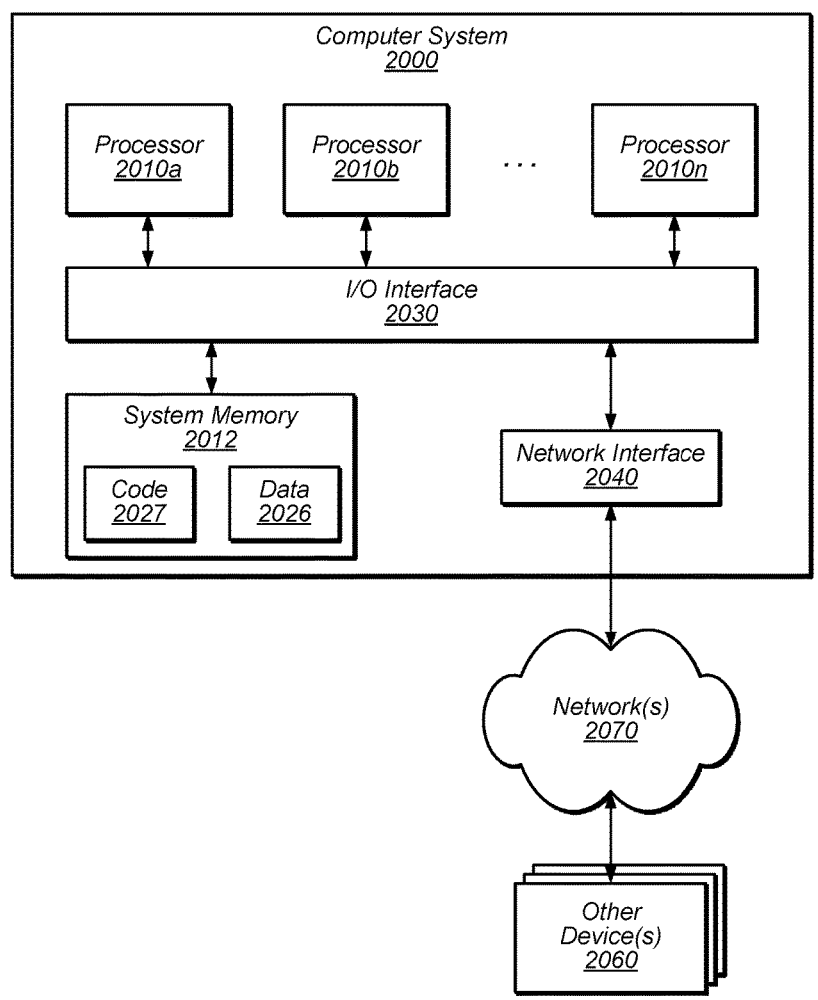
FIG. 20 illustrates a computer system that can be used in a portable data center, according to some embodiments.

FIG. 20 illustrates a computer system that can be used in a portable data center, according to some embodiments. A computer system as illustrated in FIG. 20 may be used to at least partially implement a vibration control system, a building management system, a security system, a fire monitoring system, a tracking system for a portable data center or any other system described above, according to some embodiments. In some embodiments, a computer that implements a portion or all of one or more of the technologies, including but not limited to the vibration control system, building management system, security system, fire monitoring system, or tracking system and the computing devices mounted in the portable data center along with the tethered piece of networking equipment as described herein, may include a general-purpose computer system that includes or is configured to access one or more computer-accessible media, such as computer system 2000 illustrated in FIG. 20. In the illustrated embodiment, computer system 2000 includes one or more processors 2010 coupled to a system memory 2020 via an input/output (I/O) interface 2030. Computer system 2000 further includes a network interface 2040 coupled to I/O interface 2030.

In various embodiments, computer system 2000 may be a uniprocessor system including one processor 2010, or a multiprocessor system including several processors 2010 (e.g., two, four, eight, or another suitable number). Processors 2010 may be any suitable processors capable of executing instructions. For example, in various embodiments, processors 2010 may be general-purpose or embedded processors implementing any of a variety of instruction set architectures (ISAs), such as the x86, PowerPC, SPARC, or MIPS ISAs, or any other suitable ISA. In multiprocessor systems, each of processors 2010 may commonly, but not necessarily, implement the same ISA.

System memory 2020 may be configured to store instructions and data accessible by processor(s) 2010. In various embodiments, system memory 2020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are stored within system memory 2020 as code 2025 and data 2026.

In one embodiment, I/O interface 2030 may be configured to coordinate I/O traffic between processor 2010, system memory 2020, and any peripheral devices in the device, including network interface 2040 or other peripheral interfaces. In some embodiments, I/O interface 2030 may perform any necessary protocol, timing or other data transformations to convert data signals from one component (e.g., system memory 2020) into a format suitable for use by another component (e.g., processor 2010). In some embodiments, I/O interface 2030 may include support for devices attached through various types of peripheral buses, such as a variant of the Peripheral Component Interconnect Express (PCIe) bus standard or the Universal Serial Bus (USB) standard, for example. In some embodiments, the function of I/O interface 2030 may be split into two or more separate components, such as a north bridge and a south bridge, for example. Also, in some embodiments some or all of the functionality of I/O interface 2030, such as an interface to system memory 2020, may be incorporated directly into processor 2010.

Network interface 2040 may be configured to allow data to be exchanged between computer system 2000 and other devices 2060 attached to a network or networks 2050, such as other computer systems or devices as illustrated in FIGS. 1 through 19, for example. In various embodiments, network interface 2040 may support communication via any suitable wired or wireless general data networks, such as types of Ethernet network, for example. Additionally, network interface 2040 may support communication via telecommunications/telephony networks such as analog voice networks or digital fiber communications networks, via storage area networks such as Fibre Channel SANs, or via any other suitable type of network and/or protocol.

In some embodiments, system memory 2020 may be one embodiment of a non-transitory computer-accessible medium configured to store program instructions and data for implementing a particular processing system that implements a control system as described above relative to FIGS. 1-19. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 2000 via I/O interface 2030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 2000 as system memory 2020 or another type of memory. Further, a computer-accessible medium may include transmission media or signals such as electrical, electromagnetic, or digital signals, conveyed via a communication medium such as a network and/or a wireless link, such as may be implemented via network interface 2040.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A portable data center comprising:
an outer structure of the portable data center; and
an internal platform mounted within the outer structure,
   wherein a top side of the internal platform functions as
   a floor for a compute space of the portable data center;
a rack of computing devices mounted on the internal
   platform; and
a vibration reduction device mounted in a sub-floor space
   between the outer structure and the internal platform,
   wherein the vibration reduction device is coupled to a
   floor of the outer structure and the internal platform;
wherein:
   the portable data center is configured to be transported
      from a first location to a second location with the
      rack of computing devices mounted on the internal
      platform; and
   the vibration reduction device is configured to reduce
      transmission of vibrations experienced by the outer
      structure of the portable data center to the internal
      platform of the portable data center while the portable data center is being transported from the first
      location to the second location.

2. The portable data center of claim 1, further comprising:
an air plenum mounted in the sub-floor space between the
   internal platform and the outer structure of the portable
   data center; and an air moving device mounted in the sub-floor space between the internal platform and the outer structure of the portable data center, wherein the air moving device is configured to draw heated air from the compute space above the internal platform and direct cool air to the compute space above the internal platform.

3. The portable data center of claim 1, further comprising additional vibration reduction devices mounted in the sub-floor space between the outer structure and the internal platform, wherein the vibration reduction device and the additional vibration reduction devices each comprise a damper mounted between the outer structure of the portable data center and the internal platform.

4. The portable data center of claim 1, wherein the vibration reduction device comprises an air cushion mounted between the outer structure of the portable data center and the internal platform.

5. The portable data center of claim 1, wherein the portable data center further comprises an additional vibration reduction device mounted in the sub-floor space between the outer structure of the portable data center and the internal platform, wherein:
the vibration reduction device is configured to dissipate vibrations having vibration frequencies within a first vibration frequency range; and
the additional vibration reduction device is configured to dissipate vibrations having vibration frequencies within a second vibration frequency range, wherein the first vibration frequency range and the second vibration frequency range are different vibration frequency ranges.

6. A system comprising:
an outer structure;
a platform mounted in the outer structure, wherein a top side of the platform functions as floor for a compute space and is configured to accept mounting of a rack of computing devices on the platform; and
a vibration reduction device mounted in a sub-floor space between the outer structure and the internal platform, wherein the vibration reduction device is coupled to a floor of the outer structure and the platform,
wherein the vibration reduction device is configured to reduce vertical transmission of vibrations experienced by the outer structure to the platform such that vibrations experienced by computing devices mounted in the rack coupled to the platform do not exceed a threshold level of vibrations in order to prevent damage to the computing devices.

7. The system of claim 6, further comprising:
an air plenum in the sub-floor space between the outer structure and the platform; and
an air moving device mounted in the sub-floor space between the platform and the outer structure, wherein the air moving device is configured to draw heated air from the compute space above the platform into the air plenum and direct cool air from the air plenum to the compute space above the platform.

8. The system of claim 7, wherein the platform further comprises:
an air vent in the platform coupling the air plenum in the-sub floor space with a hot aisle in the compute space above the platform; and
another air vent in the platform coupling the air plenum in the sub-floor space with a cold aisle in the compute space above the platform.

9. The system of claim 6, wherein the vibration reduction device comprises at least one of:

an air spring,
a mechanical spring and dashpot, or
a viscoelastic material.

10. The system of claim 6, wherein the vibration reduction device comprises an air cushion mounted in the sub-floor space between the platform and the outer structure.

11. The system of claim 6, wherein the vibration reduction device is configured to dissipate vibrations having vibration frequencies within a first vibration frequency range,
wherein the system further comprises an additional vibration reduction device configured to dissipate vibrations having vibration frequencies within a second vibration frequency range,
wherein the first vibration frequency range and the second vibration frequency range are different vibration frequency ranges.

12. The system of claim 6, wherein the vibration reduction device is configured to dissipate vibrations having vibration frequencies within a vibration frequency range corresponding to road induced vibrations; and
wherein the system further comprises an additional vibration reduction device configured to absorb a sudden impact experienced by the outer structure.

13. The system of claim 6, further comprising:
racks of computing devices mounted on the platform; and
a structural member coupled to the racks, wherein the structural member is configured to connect the racks such that the racks behave as a common mass in response to vibrations experienced by the outer structure.

14. The system of claim 6, wherein the vibration reduction device comprises an active damping system.

15. A method comprising:
transporting a portable data center from a first location to a second location,
wherein said transporting comprises:
storing data on computing devices mounted in the portable data center on a platform while the portable data center is transported from the first location to the second location, wherein a top side of the platform functions as a floor for a compute space of the portable data center in which the computing devices are mounted; and
dissipating, by a vibration reduction device mounted in a sub-floor space below the floor of the compute space and between a floor of an outer structure of the portable data center and the platform, vibrations experienced by the outer structure of the portable data center such that a level of vibrations experienced by the computing devices mounted in the compute space on the top side of the platform do not exceed a threshold level of vibration in order to prevent damage to the computing devices.

16. The method of claim 15, wherein the vibrations experienced by the outer structure of the portable data center are vibrations induced by transporting the portable data center via a vehicle travelling on a road, on a track, on water, on air, or through space.

17. The method of claim 15, further comprising:
absorbing, by an additional vibration reduction device, a sudden impact experienced by the outer structure of the portable data center such that the level of vibrations experienced by the computing devices do not exceed the threshold vibration level.

18. The method of claim 15, wherein said transporting the portable data center further comprises:

monitoring a level of vibrations experienced by the computing devices; and communicating the monitored level of vibrations to a location remote from the portable data center.

19. The method of claim 15, wherein the vibration reduction device comprises an active vibration reduction system, wherein said dissipating the vibrations comprises:

sensing vibrations experienced by the computing devices mounted in the portable data center; and adjusting a level of damping or stiffness of an adjustable vibration reduction device based on the sensed vibrations experienced by the computing devices mounted in the portable data center.

20. The method of claim 15, wherein a rack in which the computing devices are mounted, the platform, and the vibration reduction device form a vibration system that is configured to have a natural frequency that does not coincide with vibration frequencies corresponding to road vibrations.

* * * * *